(12) United States Patent
Shibazaki

(10) Patent No.: US 8,994,923 B2
(45) Date of Patent: Mar. 31, 2015

(54) MOVABLE BODY APPARATUS, EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 817 days.

(21) Appl. No.: 12/561,533

(22) Filed: Sep. 17, 2009

(65) Prior Publication Data

US 2010/0073653 A1 Mar. 25, 2010

Related U.S. Application Data

(60) Provisional application No. 61/098,893, filed on Sep. 22, 2008, provisional application No. 61/179,877, filed on May 20, 2009, provisional application No. 61/213,352, filed on Jun. 1, 2009, provisional application No. 61/213,372, filed on Jun. 2, 2009, provisional application No. 61/213,373, filed on Jun. 2, 2009.

(30) Foreign Application Priority Data

| May 20, 2009 | (JP) | 2009-121818 |
| May 20, 2009 | (JP) | 2009-122254 |
| May 20, 2009 | (JP) | 2009-122290 |

(51) Int. Cl.
*G03B 27/58* (2006.01)
*G03F 7/20* (2006.01)
*H01L 21/68* (2006.01)

(52) U.S. Cl.
CPC ........ *G03F 7/70725* (2013.01); *G03F 7/70716* (2013.01); *G03F 7/70775* (2013.01); *H01L 21/681* (2013.01)
USPC .......................................................... 355/72

(58) Field of Classification Search
CPC ............ G03F 7/70716; G03F 7/70725; G03F 7/70775
USPC .......................................................... 355/72
See application file for complete search history.

(56) References Cited

U.S. PATENT DOCUMENTS

| 4,171,162 A | 10/1979 | Gerard et al. |
| 4,780,617 A | 10/1988 | Umatate et al. |

(Continued)

FOREIGN PATENT DOCUMENTS

| EP | 1 796 144 A1 | 6/2007 |
| EP | 2 068 112 A1 | 6/2009 |

(Continued)

OTHER PUBLICATIONS

International Search Report issued in International Patent Application No. PCT/JP2009/066848 on Apr. 14, 2010.

(Continued)

*Primary Examiner* — Peter B Kim
*Assistant Examiner* — Michelle Iacoletti
(74) *Attorney, Agent, or Firm* — Oliff PLC

(57) ABSTRACT

In measurement of a positional information in the XY plane of a fine movement stage held by a coarse movement stage, an encoder system is used including a head which is placed facing a grating placed on a surface substantially parallel to the XY plane of the fine movement stage and irradiates a measurement beam on the grating. Then, the fine movement stage is driven individually or integrally with the coarse movement stage by a drive system, based on the positional information measured by the encoder system. In this case, the head of the encoder system can be placed in proximity to the fine movement stage (the grating), which allows a highly precise measurement of the positional information of the fine movement stage by the encoder system.

48 Claims, 18 Drawing Sheets

(56) References Cited

U.S. PATENT DOCUMENTS

| | | | |
|---|---|---|---|
| 5,196,745 A | 3/1993 | Trumper | |
| 5,448,332 A | 9/1995 | Sakakibara et al. | |
| 5,610,715 A | 3/1997 | Yoshii et al. | |
| 5,646,413 A | 7/1997 | Nishi | |
| 5,666,196 A * | 9/1997 | Ishii et al. | 356/499 |
| 6,259,174 B1 | 7/2001 | Ono | |
| 6,542,224 B2 * | 4/2003 | Ackerman et al. | 355/72 |
| 6,570,644 B2 * | 5/2003 | Binnard et al. | 355/72 |
| 6,611,316 B2 | 8/2003 | Sewell | |
| 6,778,257 B2 | 8/2004 | Bleeker et al. | |
| 6,956,222 B2 * | 10/2005 | Gilissen et al. | 250/492.2 |
| 7,023,610 B2 | 4/2006 | Ohtsuki et al. | |
| 7,161,659 B2 * | 1/2007 | Van Den Brink et al. | 355/53 |
| 7,238,931 B2 | 7/2007 | Nabeshima et al. | |
| RE41,232 E * | 4/2010 | Hazelton et al. | 310/12.06 |
| 7,999,918 B2 | 8/2011 | Shibazaki | |
| 2002/0041377 A1 | 4/2002 | Hagiwara et al. | |
| 2003/0025890 A1 | 2/2003 | Nishinaga | |
| 2004/0263846 A1 | 12/2004 | Kwan | |
| 2006/0061751 A1 * | 3/2006 | Teng et al. | 355/72 |
| 2006/0101928 A1 | 5/2006 | Binnard et al. | |
| 2006/0187431 A1 | 8/2006 | Shibazaki | |
| 2007/0035267 A1 | 2/2007 | Gao et al. | |
| 2007/0109522 A1 | 5/2007 | Ebihara et al. | |
| 2007/0263191 A1 | 11/2007 | Shibazaki | |
| 2007/0267995 A1 | 11/2007 | Binnard et al. | |
| 2007/0288121 A1 | 12/2007 | Shibazaki | |
| 2008/0043212 A1 | 2/2008 | Shibazaki | |
| 2008/0074681 A1 | 3/2008 | Loopstra et al. | |
| 2008/0088843 A1 | 4/2008 | Shibazaki | |
| 2008/0094592 A1 | 4/2008 | Shibazaki | |
| 2008/0094593 A1 | 4/2008 | Shibazaki | |
| 2008/0094594 A1 | 4/2008 | Shibazaki | |
| 2008/0094604 A1 | 4/2008 | Shibazaki | |
| 2008/0106722 A1 | 5/2008 | Shibazaki | |
| 2008/0143994 A1 | 6/2008 | Shibazaki | |
| 2008/0218713 A1 | 9/2008 | Shibazaki | |
| 2008/0236997 A1 | 10/2008 | Ebihara | |
| 2008/0278705 A1 | 11/2008 | Binnard et al. | |
| 2009/0059194 A1 * | 3/2009 | Kanaya | 355/53 |
| 2009/0207422 A1 | 8/2009 | Loopstra et al. | |
| 2009/0233234 A1 | 9/2009 | Shibazaki | |

FOREIGN PATENT DOCUMENTS

| | | |
|---|---|---|
| JP | A-11-178311 | 7/1999 |
| WO | WO 01/35168 A1 | 5/2001 |
| WO | WO 2005/098911 A1 | 10/2005 |
| WO | WO 2006/038952 A2 | 4/2006 |
| WO | WO 2007/049603 A1 | 5/2007 |
| WO | WO 2007/083758 A1 | 7/2007 |
| WO | WO 2007/097379 A1 | 8/2007 |
| WO | WO 2007/097380 A1 | 8/2007 |
| WO | WO 2008/038752 A1 | 4/2008 |
| WO | WO 2008/056735 A1 | 5/2008 |
| WO | WO 2009/050675 A2 | 4/2009 |

OTHER PUBLICATIONS

Written Opinion of the International Searching Authority issued in Patent Application No. PCT/JP2009/066848 on Apr. 30, 2010.

Yuichi Shibazaki et al., U.S. Appl. No. 12/385,577, filed Apr. 13, 2009.

International Search Report issued in Application No. PCT/JP2009/066847 on Dec. 16, 2009.

Written Opinion of the International Searching Authority issued in Application No. PCT/JP2009/066847 on Dec. 16, 2009.

Mar. 2, 2012 Office Action issued in U.S. Appl. No. 12/561,480.

May 24, 2013 Office Action issued in Japanese Patent Application No. 2009-217103 (with translation).

May 22, 2013 Office Action issued in Japanese Patent Application No. 2009-217081 (with translation).

Apr. 24, 2014 Office Action issued in Japanese Patent Application No. 2009-217103 (with translation).

* cited by examiner

MOVABLE BODY APPARATUS, EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/098,893 filed Sep. 22, 2008, Provisional Application No. 61/179,877 filed May 20, 2009, Provisional Application No. 61/213,352 filed Jun. 1, 2009, Provisional Application No. 61/213,372 filed Jun. 2, 2009, and Provisional Application No. 61/213,373 filed Jun. 2, 2009, the disclosures of which are hereby incorporated herein by reference in its entirety.

BACKGROUND OF THE INVENTION

1. Field of the Invention

The present invention relates to movable body apparatuses, exposure apparatuses, exposure methods, and device manufacturing methods, and more particularly to a movable body apparatus including a movable body which is movable along a two-dimensional plane, an exposure apparatus including the movable body apparatus, an exposure method using the movable body apparatus, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner)) are mainly used.

In these types of exposure apparatuses, the position of a wafer stage which moves two-dimensionally, holding a substrate (hereinafter generally referred to as a wafer) such as a wafer or a glass plate on which a pattern is transferred and formed, was measured using a laser interferometer in general. However, requirements for a wafer stage position control performance with higher precision are increasing due to finer patterns that accompany higher integration of semiconductor devices recently, and as a consequence, short-term variation of measurement values due to temperature fluctuation and/or the influence of temperature gradient of the atmosphere on the beam path of the laser interferometer can no longer be ignored.

To improve such an inconvenience, various proposals of inventions related to an exposure apparatus that has employed an encoder having a measurement resolution of the same level or better than a laser interferometer as the position measuring device of the wafer stage have been made (refer to, e.g., PCT International Publication No. 2007/097379). However, in the liquid immersion exposure apparatus disclosed in PCT International Publication No. 2007/097379 (the corresponding U.S. Patent Application Publication. No. 2008/0088843) and the like, there still were points that should have been improved, such as a threat of the wafer stage (a grating installed on the wafer stage upper surface) being deformed when influenced by heat of vaporization and the like when the liquid evaporates.

To improve such an inconvenience, for example, in PCT International Publication No. 2008/038752 (the corresponding U.S. Patent Application Publication No. 2008/0094594), as a fifth embodiment, an exposure apparatus is disclosed which is equipped with an encoder system that has a grating arranged on the upper surface of a wafer stage configured by a light transmitting member and measures the displacement of the wafer stage related to the periodic direction of the grating by making a measurement beam from an encoder main body placed below the wafer stage enter the wafer stage and be irradiated on the grating, and by receiving a diffraction light which occurs in the grating. In this apparatus, because the grating is covered with a cover glass, the grating is immune to the heat of vaporization, which makes it possible to measure the position of the wafer stage with high precision.

However, the placement of the encoder main body adopted in the exposure apparatus related to the fifth embodiment of PCT International Publication No. 2008/038752 was difficult to adopt in the case of measuring positional information of the fine movement stage using a stage device that is a combination of a coarse movement stage that moves on a surface plate and a fine movement stage that holds a wafer and relatively moves on the coarse movement stage with respect to the coarse movement stage, or a stage device of a so-called coarse/fine movement structure, because the coarse movement stage came between the fine movement stage and the surface plate.

Further, substrates such as a wafer, a glass plate or the like subject to exposure which are used in exposure apparatuses such as the scanner are gradually (for example, in the case of a wafer, in every ten years) becoming larger. Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more the number of chips from the current 300 mm wafer, which contributes to reducing the cost. In addition, it is expected that through efficient use of energy, water, and other resources, cost of all resource use will be reduced.

However, with the wafer size increasing, the size and the weight of the wafer stage which moves holding the wafer will also increase. Increasing weight of the wafer stage can easily degrade the position control performance of the wafer stage, especially in the case of a scanner which performs exposure (transfer of a reticle pattern) during a synchronous movement of a reticle stage and a wafer stage as is disclosed in, for example, U.S. Pat. No. 5,646,413, whereas, increasing size of the wafer stage will increase the footprint of the apparatus. Therefore, it is desirable to make the size and the weight of a movable member which moves holding a wafer be thin and light. However, because the thickness of the wafer does not increase in proportion to the size of the wafer, intensity of the 450 mm wafer is much weaker when compared to the 300 mm wafer, therefore, in the case of making the movable member thin, there was a concern of the movable member deforming by the weight of the wafer and the movable member itself, and as a consequence, the wafer held by the movable member could also be deformed, which would degrade the transfer accuracy of the pattern to the wafer.

Accordingly, appearance of a new system that can deal with the 450 mm wafer is expected.

SUMMARY OF THE INVENTION

The present invention was made under the circumstances described above, and according to a first aspect of the present invention, there is provided a movable body apparatus, comprising: a first movable member which is movable at least along a two-dimensional plane including a first axis and a second axis that are orthogonal to each other; a second movable member which is held by the first movable member and is relatively movable at least with respect to the first movable member within a plane parallel to the two-dimensional plane, and whose measurement plane is provided on a surface substantially parallel to the two-dimensional plane; a first measurement system which has a head section irradiating at least one first measurement beam on the measurement plane and receiving light of the first measurement beam from the measurement plane, and measures a positional information at least within the two-dimensional plane of the second movable member based on an output of the head section; and a drive system which drives the second movable member in one of a singly driven and integrally driven manner with the first movable member, based on the positional information measured by the first measurement system.

According to this apparatus, to measure the positional information of the second movable member held by the first movable member within the two-dimensional plane, the first measurement system is used that includes a head section which is placed facing the measurement plane provided on a surface substantially parallel to the two-dimensional plane of the second movable member and irradiates at least one first measurement beam on the measurement plane. And, the second movable member is driven by the drive system individually or integrally with the first movable member, based on the positional information measured by the first measurement system. In this case, the head section can be placed in proximity to the second movable member (measurement plane), which allows a measurement of the positional information of the second movable member by the first measurement system with high precision, which in turn allows a drive with high precision of the second movable member by the drive system.

According to a second aspect of the present invention, there is provided a first exposure apparatus that forms a pattern on an object by an irradiation of an energy beam, the apparatus comprising: the movable body apparatus of the present invention which has the object mounted on the second movable member; and a patterning device that irradiates the energy beam on the object mounted on the second movable member.

According to this apparatus, because the second movable member configuring the movable body apparatus can be driven with good precision, it becomes possible to transfer a pattern on the object by driving the object mounted on the second movable member with good precision, and irradiating the energy beam on the object with the patterning device.

According to a third aspect of the present invention, there is provided a second exposure apparatus that forms a pattern on an object by an irradiation of an energy beam, the apparatus comprising: a first movable member which is movable at least along a two-dimensional plane including a first axis and a second axis that are orthogonal to each other; a second movable member whose one end and the other end in a direction parallel to the second axis are each supported by the first movable member, so that the second movable member is relatively movable with respect to the first movable member within a plane parallel to the two-dimensional plane while holding the object; and a drive system which includes a first drive section that applies a drive force on the one end of the second movable member and a second drive section that applies a drive force on the other end, and drives the second movable member in one of a singly driven and integrally driven manner with the first movable member, whereby the first and second drive sections can apply a drive force whose magnitude and a direction of generation can each be controlled independently to the one end and the other end of the second movable member, in a direction parallel to the first axis and the second axis, a direction orthogonal to a two-dimensional plane, and a rotational direction around an axis parallel to the first axis.

According to this apparatus, one end and the other end in a direction parallel to the second axis of the second movable member are each supported by the first movable member, so that the second movable member is relatively movable with respect to the first movable member within a plane parallel to the two-dimensional plane while holding the object. And, by the first and second drive sections configuring a part of the drive system, a drive force (whose magnitude and a direction of generation can each be controlled independently) is applied to the one end and the other end of a direction parallel to the second axis of the second movable member, each in a direction parallel to the first axis and the second axis, a direction orthogonal to a two-dimensional plane, and a rotational direction around an axis parallel to the first axis. Accordingly, by the first and the second drive sections, not only can the second movable member be driven in a direction parallel to the first axis and the second axis, and a direction orthogonal to the two dimensional plane, but by the first and second drive sections applying a drive force in a rotational direction around an axis parallel to the first axis simultaneously in opposite directions to the one end and the other end of the holding member, the second movable member (and the object held by the member) can be deformed into a concave shape or a convex shape when viewed (in a plane perpendicular to the first axis) from a direction parallel to the first axis. In other words, in the case when the second movable member (and the object held by the member) is deformed by its own weight and the like, this deformation can be suppressed.

According to a fourth aspect of the present invention, there is provided a third exposure apparatus that exposes an object with an energy beam, the apparatus comprising: a first and second movable body which are independently movable within a two-dimensional plane and have a space inside; an exposure station in which an exposure process where the energy beam is irradiated on an object held by a holding member supported relatively movable by the first movable body; a measurement station which is placed away from the exposure station on one side of a direction parallel to the first axis within the two-dimensional plane, and performs a measurement process to an object held by a holding member supported relatively movable by the second movable body; a first drive system which applies a drive force to one end and the other end in a direction parallel to the second axis of the holding member held by the first movable body; and a second drive system which applies a drive force to one end and the other end in a direction parallel to the second axis of the holding member held by the second movable body, wherein the first and second drive systems can apply a drive force whose magnitude and a direction of generation can each be controlled independently to the one end and the other end of each of the holding members, in a direction parallel to the first axis and the second axis, a direction orthogonal to a two-dimensional plane, and a rotational direction around an axis parallel to the first axis.

According to this apparatus, by the first and second drive systems applying a force in a rotational direction around the first axis in opposite directions to one end and the other end in a direction parallel to the second axis of each holding member supported relatively movable by the first and second movable bodies, respectively, deflection correction of the object subject to exposure and the holding member holding the object in the exposure station can be performed, along with deflection correction of the holding member on measurement in the measurement station and the object held by the holding member. Accordingly, it becomes possible to perform a highly precise measurement processing of the object, and a highly precise exposure processing of the object using the measurement results.

According to a fifth aspect of the present invention, there is provided a device manufacturing method, the method including: exposing an object using any one of the first to third exposure apparatuses of the present invention; and developing the object which has been exposed.

According to a sixth aspect of the present invention, there is provided a first exposure method in which a pattern is formed on an object by an irradiation of an energy beam, the method comprising: a mounting process in which the object is mounted on a second movable member that is held relatively movable with respect to a first movable member at least within a plane parallel to a two-dimensional plane by the first movable member, which is movable at least along a two-dimensional plane including a first axis and a second axis that are orthogonal to each other, and has a measurement plane provided on a surface substantially parallel to the two-dimensional plane; and a scanning process in which the object is scanned with respect to the energy beam by measuring a positional information at least within the two-dimensional plane of the second movable member based on an output of a head section, which irradiates at least one first measurement beam on the measurement plane, and receives a light of the first measurement beam from the measurement plane, and by driving the second movable member in a scanning direction within the two-dimensional plane based on the positional information which has been measured.

According to this method, the second movable member can be driven with high precision at the time of scanning exposure, which allows a highly precise exposure of the object.

According to a seventh aspect of the present invention, there is provided a second exposure method in which a pattern is formed on an object by an irradiation of an energy beam, the method comprising: making a first movable member, which is movable at least along a two-dimensional plane including a first axis and a second axis that are orthogonal to each other, support both one end and the other end in a direction parallel to the second axis of a second movable member holding the object, so that the second movable member becomes relatively movable within a plane parallel to the two-dimensional plane with respect to the first movable member; and applying a drive force whose magnitude and a direction of generation can each be controlled independently, to the one end and the other end of the second movable member, in a direction parallel to the first axis and the second axis, a direction orthogonal to a two-dimensional plane, and a rotational direction around an axis parallel to the first axis.

According to this method, the holding member holding the object has both one end and the other end in a direction parallel to the second axis supported by the movable body so that the holding member becomes relatively movable with respect to the movable body in a plane parallel to the two-dimensional plane. And to each of the one end and the other end in a direction parallel to the second axis of the holding member, a drive force (whose magnitude and a direction of generation can each be controlled independently) is applied in a direction parallel to the first axis and the second axis, a direction orthogonal to the two-dimensional plane, and a rotational direction around an axis parallel to the first axis. Accordingly, not only can the holding member be driven in a direction parallel to the first axis and the second axis and a direction orthogonal to the two-dimensional plane, by applying drive forces simultaneously in directions opposite to each other around an axis parallel to the first axis to one end and the other end of the holding member in a direction parallel to the second axis, the holding member (and the object held by the member) can be deformed to a concave shape or a convex shape when viewed from a direction perpendicular to the first axis. In other words, in the case when the holding member (and the object held by the member) is deformed by its own weight and the like, this deformation can be suppressed.

According to an eighth aspect of the present invention, there is provided a device manufacturing method, the method including: exposing an object using one of the first and second exposure methods of the present invention; and developing the object which has been exposed.

BRIEF DESCRIPTION OF THE DRAWINGS

In the accompanying drawings.

DESCRIPTION OF THE EMBODIMENTS

An embodiment of the present invention will be described below, with reference to FIGS. 1 to 15C.

Figure 1:
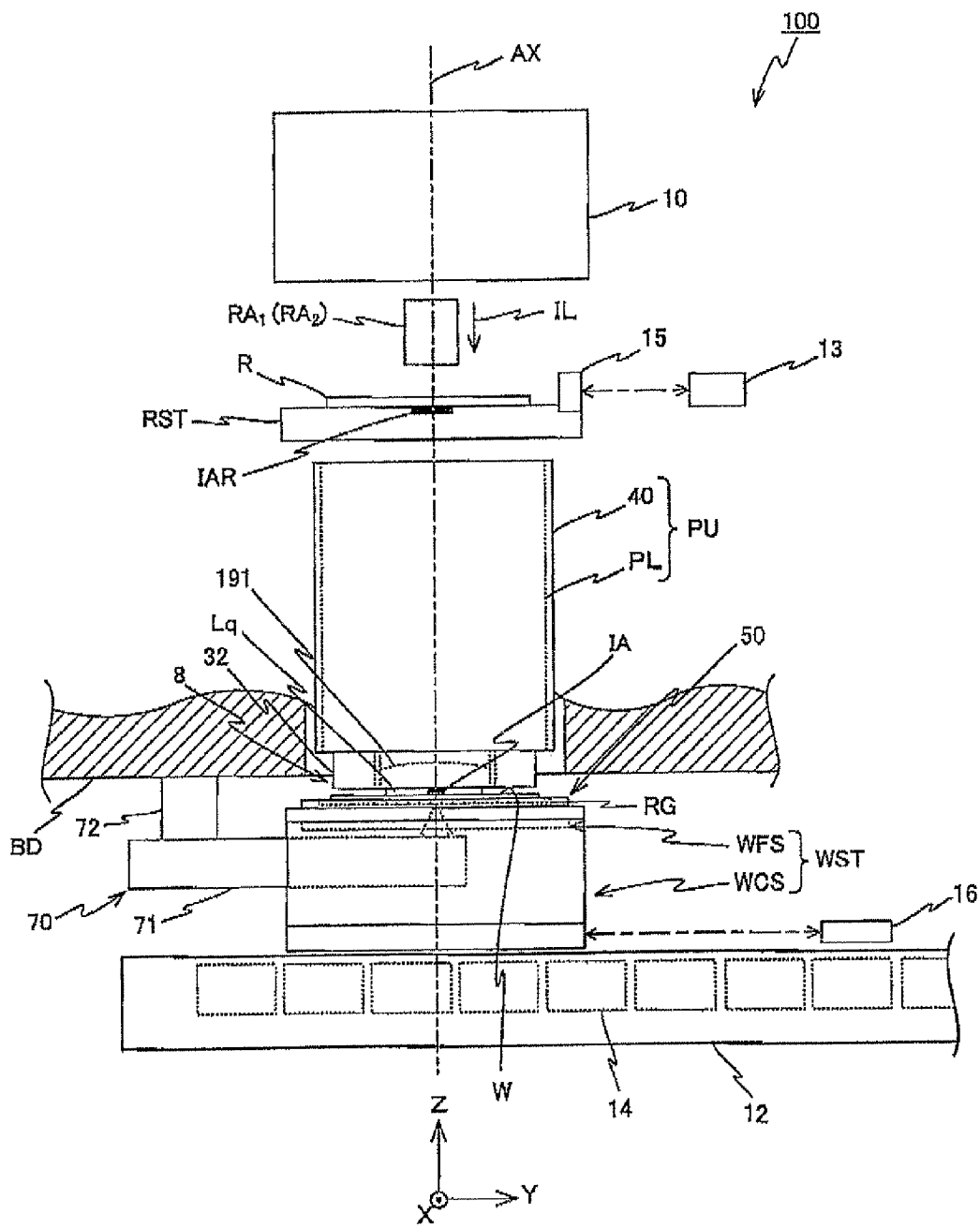
FIG. 1 is a view that schematically shows a configuration of an exposure apparatus of an embodiment.
Figure 2:
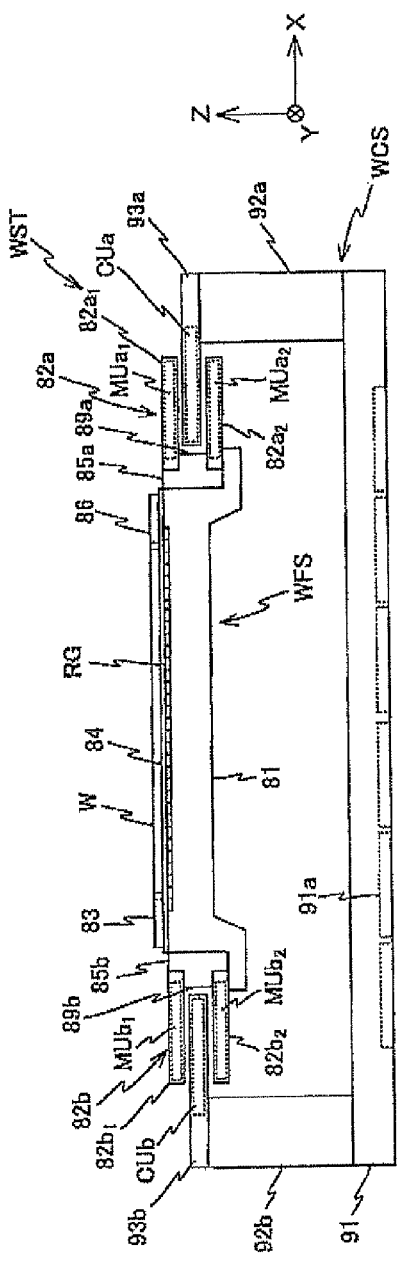
FIG. 2A shows a side view of a stage device which the exposure apparatus in FIG. 1 is equipped with when viewed from a −Y direction.
FIG. 2B is the stage device shown in a planar view.

FIG. 1 shows a schematic configuration of an exposure apparatus 100 in the embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

As shown in FIG. 1, exposure apparatus 100 is equipped with an illumination system 10, a reticle stage RST, a projection unit PU, a local liquid immersion device 8, a stage device 50 which has a fine movement stage WFS, and a control system of these sections and the like. In FIG. 1, a wafer W is mounted on fine movement stage WFS.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/025890 and the like. Illumination system 10 illuminates a slit-shaped illumination area IAR which is set on a reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 4) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 4). Incidentally, positional information of reticle stage RST can be measured by an encoder system as is disclosed in, for example, U.S. Patent Application Publication No. 2007/0288121 and the like.

Projection unit PU is placed below reticle stage RST in FIG. 1. Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R, by illumination light IL which has passed through reticle R placed so that its pattern surface substantially coincides with a first plane (object plane) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W whose surface is coated with a resist (sensitive agent) and is placed on a second plane (imaging plane) side of projection optical system PL. And by reticle stage RST and fine movement stage WFS being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern is generated on wafer W according to illumination system 10, reticle R, and projection optical system PL, and then by the exposure of the sensitive layer (resist layer) on wafer W with illumination light IL, the pattern is formed on wafer W. Now, projection unit PU is held by a main frame BD, and in the embodiment, main frame BD is supported almost horizontally by a plurality of (e.g. three or four) support members which are each placed on an installation surface (floor surface) via a vibration isolation mechanism. Incidentally, the vibration isolation mechanism can be placed between each of the support members and mainframe BD. Further, as is disclosed in, for example, PCT International Publication No. 2006/038952, projection unit PU can be supported by suspension with respect to a mainframe member (not shown) placed above projection unit PU or with respect to a reticle base.

Local liquid immersion device 8 is provided corresponding to the point that exposure apparatus 100 of the embodiment performs exposure by a liquid immersion method. Local liquid immersion device 8 includes a liquid supply device 5, a liquid recovery device 6 (both of which are not shown in FIG. 1, refer to FIG. 4), a nozzle unit 32 and the like. As shown in FIG. 1, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 4), and supplies liquid between tip lens 191 and wafer W, as well as control liquid recovery device 6 (refer to FIG. 4), and recovers liquid from between tip lens 191 and wafer W. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as the liquid above, pure water that transmits the ArF excimer laser beam (light with a wavelength of 193 nm) is to be used. Incidentally, refractive index n of the water with respect to the ArF excimer laser beam is around 1.44, and in the pure water, the wavelength of illumination light IL is 193 nm×1/n, shorted to around 134 nm.

As shown in FIG. 1, stage device 50 is equipped with a base board 12 which is almost horizontally supported by vibration isolation mechanisms (omitted in drawings) on the floor surface, a wafer stage WST which moves on base board 12 holding wafer W, a wafer stage drive system 53 (refer to FIG. 4), various measurement systems (16, 70 (refer to FIG. 4) and the like) and the like.

Base board 12 is made of a member having a tabular form, and the degree of flatness of the upper surface is extremely high and serves as a guide surface when wafer stage WST moves.

As shown in FIGS. 1, 2A and the like, wafer stage WST has a wafer coarse movement stage (hereinafter, shortly described as a coarse movement stage) WCS, which is supported by levitation above base board 12 by a plurality of non-contact bearings (e.g., air bearings (omitted in drawings)) provided on its bottom surface and is driven in an XY two-dimensional direction by a coarse movement stage drive system 51 (refer to FIG. 4) which configures a part of wafer stage drive system 53, and a wafer fine movement stage (hereinafter, shortly described as a fine movement stage) WFS, which is supported in a non-contact manner by coarse movement stage WCS and is relatively movable with respect to coarse movement stage WCS. Fine movement stage WFS is driven by a fine movement stage drive system 52 (refer to FIG. 4), which configures a part of wafer stage drive system 53, with respect to coarse movement stage WCS in directions of six degrees of freedom (X, Y, Z, θx, θy, θz). In the embodiment, wafer stage drive system 53 is configured, including coarse movement stage drive system 51 and fine movement stage drive system 52.

Positional information (also including rotation information in the θz direction) in the XY plane of wafer stage WST (coarse movement stage WCS) is measured by a wafer stage position measurement system 16. Further, positional information of fine movement stage WFS in directions of six degrees of freedom (X, Y, Z, θx, θy, θz) is measured by a fine movement stage position measurement system 70 (refer to FIG. 4). Measurement results of wafer stage position measurement system 16 and fine movement stage position measurement system 70 are supplied to main controller 20 (refer to FIG. 4) for position control of coarse movement stage WCS and fine movement stage WFS.

Configuration and the like of each part configuring stage device 50 including the various measurements system described above will be explained in detail, later on.

In exposure apparatus 100, a wafer alignment system ALG (not shown in FIG. 1, refer to FIG. 4) is placed at a position a predetermined distance away on the +Y side from the center of projection unit PU. As wafer alignment system ALG, for example, an FIA (Field Image Alignment) system by an image processing method is used wafer alignment system ALG is used by main controller 20 on wafer alignment (e.g., Enhanced Global Alignment (EGA)) when detecting a second fiducial mark that will be described later formed on a measurement plate on fine movement stage WFS, or when detecting an alignment mark on wafer W. Imaging signals of wafer alignment system ALG is supplied to main controller 20 via a signal processing system (not shown). Main controller 20 computes X, Y coordinates of an object mark in a coordinate system at the time of alignment, based on detection results (imaging results) of alignment system ALG and positional information of fine movement stage WFS (wafer w) at the time of detection.

Besides this, in exposure apparatus 100 of the embodiment, a multiple point focal point position detection system (hereinafter shortly referred to as a multipoint AF system) AF (not shown in FIG. 1, refer to FIG. 4) having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 4), via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of wafer alignment detection system ALG, and at the time of exposure, the so-called focus leveling control of wafer W can be performed, using the surface position information and measurement values of a laser interferometer system 75 (refer to FIG. 4) configuring a part of fine movement stage position measurement system 70 which will be described later on. Incidentally, measurement values of an encoder system 73 which will be described later configuring fine movement stage position measurement system 70 can also be used, rather than laser interferometer system 75 in focus leveling control.

Further, above reticle stage RST, as is disclosed in detail in, for example, U.S. Pat. No. 5,646,413, a pair of reticle alignment systems $RA_1$ and $RA_2$ (reticle alignment system $RA_2$ is hidden behind reticle alignment system $RA_1$ in the depth of the page surface in FIG. 1) using an image processing method is placed that has an imaging device such as a CCD and the like and uses a light (in the embodiment, illumination light IL) of the exposure wavelength as an illumination light for alignment. The pair of reticle alignment systems $RA_1$ and $RA_2$ is used to detect a positional relation between a detection center of a projection area of a pattern of reticle R by projection optical system PL and a reference position on the measurement plate, or in other words, the positional relation with a center of a pair of first fiducial marks, in a state where the measurement plate to be described later on fine movement stage WFS is positioned directly below projection optical system PL, by main controller 20 detecting a projection image of a pair of reticle alignment marks (omitted in drawings) formed on reticle R and a corresponding pair of first fiducial marks on the measurement plate via projection optical system PL. Detection signals of $RA_1$, and $RA_2$ reticle alignment detection systems $RA_1$ and $RA_2$ are supplied to main controller 20 (refer to FIG. 4), via a signal processing system (not shown). Incidentally, reticle alignment systems $RA_1$ and $RA_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Figure 4:
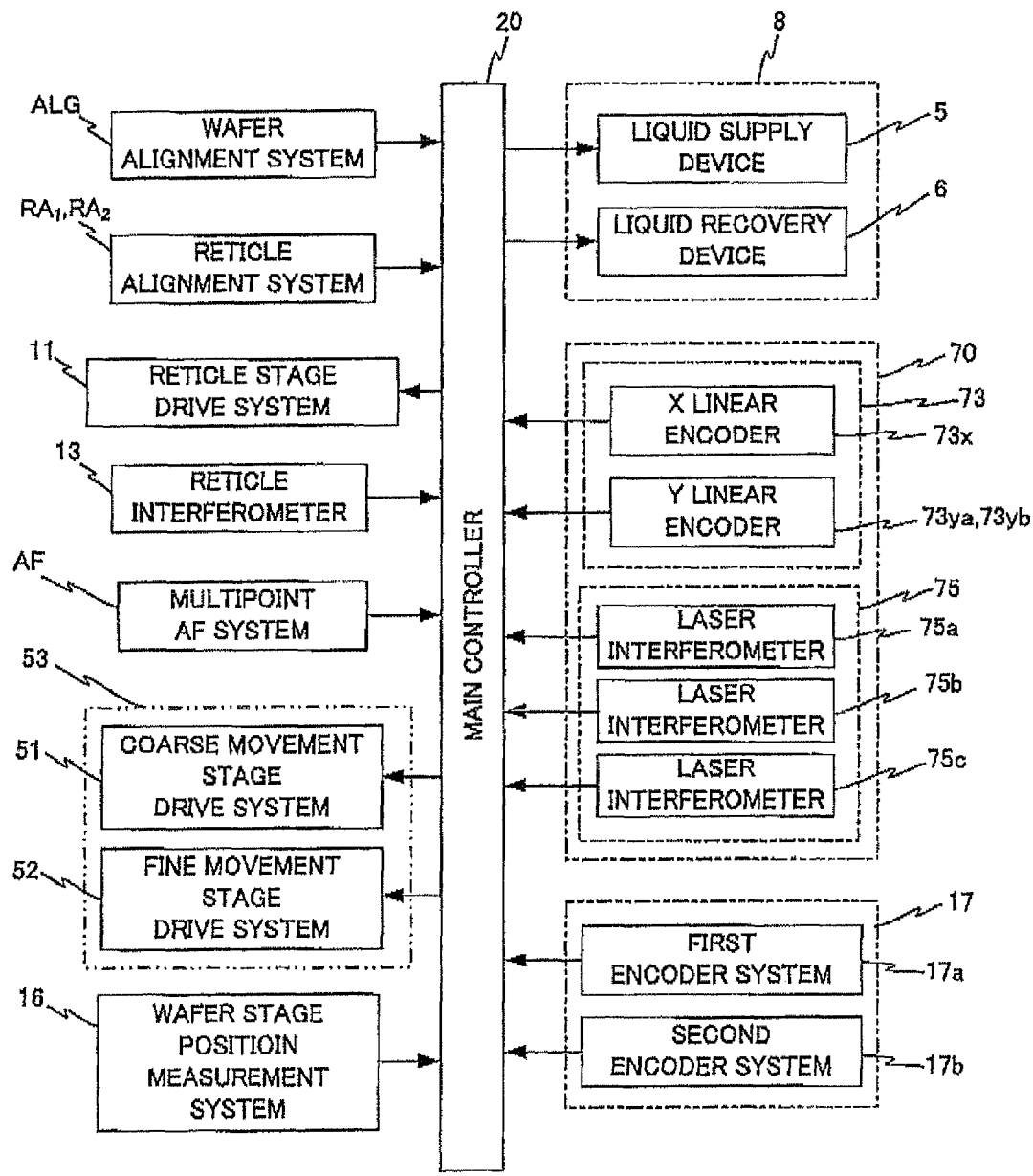
FIG. 4 is a block diagram showing a configuration of a control system of the exposure apparatus in FIG. 1.

FIG. 4 shows the main configuration of the control system of exposure apparatus 100. The control system is mainly configured of main controller 20. Main controller 20 includes a workstation (or a microcomputer) and the like, and has overall control over each part of exposure apparatus 100, such as liquid immersion device 8, coarse movement stage drive system 51, and fine movement stage drive system 52 previously described.

Now, a configuration and the like of stage device 50 will be described in detail. Inside base 12, as shown in FIG. 1, a coil unit is housed, including a plurality of coils 14 placed in the shape of a matrix with the XY two-dimensional direction serving as a row direction and a column direction, as shown in FIG. 1.

In correspondence with the coil unit, on the bottom surface (the bottom surface of a coarse movement slider section 91 to be described later) of coarse movement stage WCS, a magnet unit is provided consisting of a plurality of permanent magnets 91a placed in the shape of a matrix with the XY two-dimensional direction serving as a row direction and a column direction, as shown in FIG. 2A. The magnet unit configures a coarse movement stage drive system 51 (refer to FIG. 4) consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 4). Coarse movement stage WCS is supported by levitation on base board 12, for example, via a predetermined clearance of around several μm, by the air bearings previously described fixed in the periphery of the bottom surface of coarse movement slider section 91 in which the magnet unit described above was provided, and is driven in the X-axis direction, the Y-axis direction, and the θz direction, via coarse movement stage drive system 51. Incidentally, as coarse movement stage drive system 51, the drive method is not limited to the planar motor using the Lorentz electromagnetic force drive method, and for example, a planar motor by a variable reluctance drive system can also be used. Besides this, coarse movement stage drive system 51 can be configured by a planar motor of a magnetic levitation type. In this case, the air bearings will not have to be arranged on the bottom surface of coarse movement slider section 91.

As shown in FIG. 2A, which roughly shows an XZ section of wafer stage WST around the center in the Y-axis direction, and 2B, which is a planar view of wafer stage WST, coarse movement stage WCS is equipped with a rectangular plate shaped coarse movement slider section 91 whose longitudinal direction is in the X-axis direction in a planar view (when viewing from the +Z direction), a pair of side wall sections 92a and 92b pair of side wall sections 92a and 92b which are each fixed on the upper surface of coarse movement slider section 91 on one end and the other end in the longitudinal direction in a state parallel to a YZ plane, with the Y-axis direction serving as the longitudinal direction, and a pair of stator sections 93a and 93b that are each fixed on the upper surface of side wall sections 92a and 92b. Incidentally, in the sectional view of FIG. 2A, hatching is omitted for a clearer view of the drawing. As a whole, coarse movement stage WCS has a box like shape having a low height whose upper surface in a center in the X-axis direction and surfaces on both sides in the Y-axis direction are open. More specifically, in coarse movement stage WCS, a space is formed inside penetrating the stage in the Y-axis direction. The pair of stator sections 93a and 93b is each made of a member with a tabular outer shape, and in the inside, coil units CUa and CUb are housed consisting of a plurality of coils to drive fine movement stage WFS. The magnitude and direction of current supplied to each of the coils configuring coil units CUa and CUb are controlled by main controller 20 (refer to FIG. 3). The configuration of coil units CUa and CUb will be described further, later in the description.

As shown in FIGS. 2A and 2B, the pair of stator sections 93a and 93b each has a rectangle tabular shape whose longitudinal direction is in the Y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS is equipped with a main body section 81 having an octagonal shape whose longitudinal direction is in the X-axis direction in a planar view, and a pair of mover sections 82a and 82b that are each fixed to one end and the other end of main body section 81 in the longitudinal direction.

Figure 3:
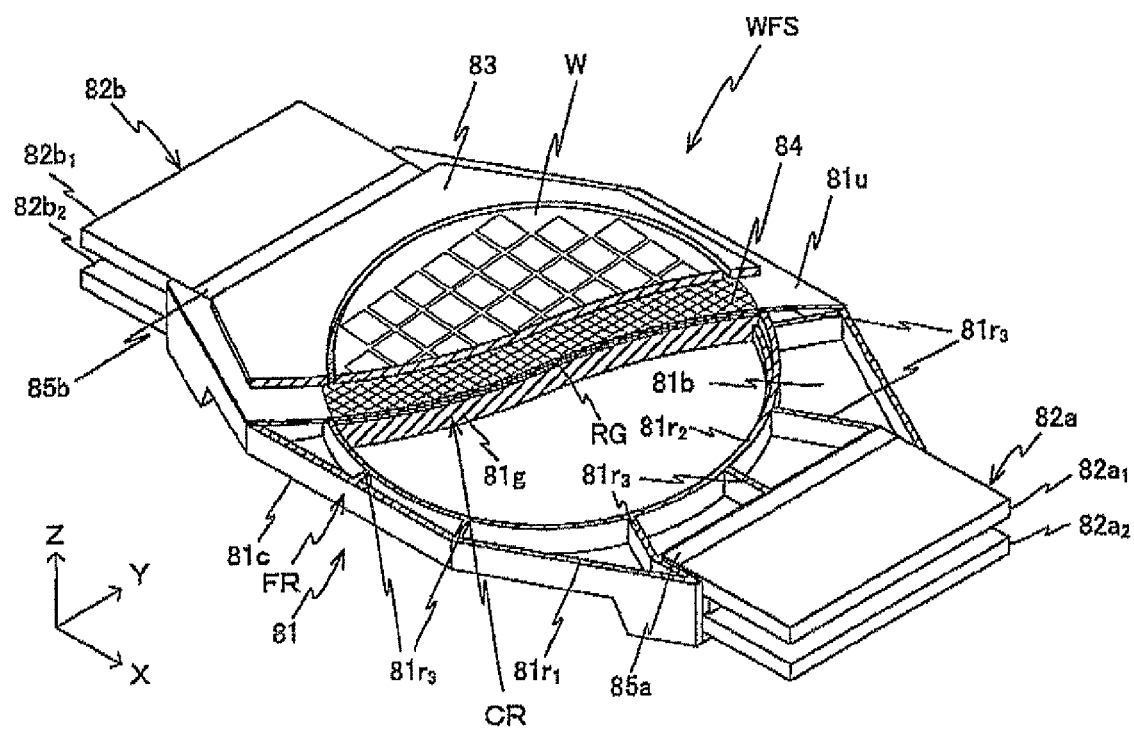
FIG. 3 is a perspective view of a configuration of a fine movement stage configuring a part of the stage device shown in FIGS. 2A and 2B.

FIG. 3 shows fine movement stage WFS, in a partially broken view. As shown in FIG. 3, main body section 81 is configured of two sections; a frame section FR, and a center section CR which is placed within a circular opening formed in the center section of frame FR without any gaps and fixed integrally to frame section FR.

Frame section FR has a top plate 81u, a frame member 81c, and a bottom section 81b. Top plate 81u has an octagonal shape whose length in the X-axis direction is longer when compared with the length in the Y-axis direction in a planar view (when viewing from above), and a circular opening, which is slightly larger than wafer W, is also formed in the center. Frame member 81c has an outer wall $81r_1$ which has the same shape as the outer shape (contour) of top plate 81u, an inner wall $81r_2$ which has the same shape as the circular opening of frame member 81c, and a plurality of ribs $81r_3$ which connects outer wall $81r_1$ and inner wall $81r_2$. On the inner side of inner wall $81r_2$, as it can be seen from FIG. 3, a step section whose lower half section projects more to the inside than the upper half section is formed along on inner periphery surface.

Top plate 81u and frame member 81c are integrated together, with top plate 81u being fixed to the upper surface of frame member 81c. On this integration, outer wall $81r_1$ and inner wall $81r_2$ support the outer edge and the inner edge of top plate 81u, respectively.

Bottom section 81b is fixed to a bottom surface of frame member 81c. In this case, by top plate 81u, frame member 81c, and bottom section 81b, a space is formed sectioned by the plurality of ribs $81r_3$, inside frame section FR. Bottom section 81b has a plate shaped portion which is the same shape as top plate 81u, and a pair of extending sections on both sides in the X-axis direction (refer to FIG. 2A).

At least a part of frame section FR should be configured of a material that is lighter, stronger, and has a lower thermal expansion than a transparent plate to be described later, which configures center section CR. As such a material, for example, ceramics is preferable. In the case of using ceramics, frame section FR can be made as an integrated object. Now, to strengthen (to provide high rigidity to) the frame section, rib $81r_3$ can be further increased, or the plurality of ribs can be combined into an appropriate shape, such as in a grid shape and the like. Further, if the intensity of the frame section is sufficient enough, bottom section 81b (except for the extending section described above) does not necessarily have to be provided.

Center section CR includes a transparent plate 81g, a grating RG, and a cover glass 84. Transparent plate 81g is made of a disc-shaped member, which has a stepped portion formed on its outer periphery surface that fits tightly with the stepped portion formed on the inner periphery surface of inner wall 81$r_2$ of frame member 81c.

Now, transparent plate 81g has an even thickness slightly thicker than the height of inner wall 81$r_2$, and is formed of a member through which light can pass (a transparent material), so that a measurement beam (a laser beam) of an encoder system which will be described later can proceed inside the plate. Further, transparent plate 81g is formed solid (without any space inside) in the embodiment, in order to reduce the influence of air fluctuation to the laser beam inside the plate. Incidentally, it is preferable for transparent plate 81g to have a low thermal expansion, and as an example in the embodiment, synthetic quarts (glass) is used. Incidentally, main body section 81 can be structured all by a transparent material.

Grating RG is fixed to (or formed on) the upper surface of transparent plate 81g. As grating RG, a circular two-dimensional grating is used, including a reflection diffraction grating (X diffraction grating) whose periodic direction is in the X-axis direction, and a reflection grating (Y diffraction grating) whose periodic direction is in the Y-axis direction. In the embodiment, the area (hereinafter, forming area) on transparent plate 81g where a two-dimensional grating is fixed or formed, as an example, is in a circular shape which is one size larger than wafer W. Furthermore, in the embodiment, the diameter of the forming area of grating RG is equal to the diameter of the inner periphery surface of inner wall 81$r_2$.

Cover glass 84 is a protective member protecting grating RG, and is applied to the upper surface of grating RG. Cover glass 84 has a circular shape with the same diameter as the opening of top plate 81u, and its surface forms a flush surface with top plate 81u. Incidentally, as the protective member (cover glass 84), while a material the same as transparent plate 81g can be used, as well as this, for example, ceramics, which is the same as frame section 81c, or metal can also be used. Further, although a plate shaped protective member is desirable because a sufficient thickness is required to protect grating RG, a thin film protective member can also be used depending on the material. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG.

On the upper surface (in the center of the upper surface of fine movement stage WFS) of cover glass 84, a wafer holder (not shown) is arranged which holds wafer W by vacuum suction or the like. In the embodiment, for example, a wafer holder of a-so-called pin chuck method on which a plurality of support sections (pin members) supporting wafer W are farmed within a loop shaped projecting section (rim section) is used, and grating RG previously described is provided on the other surface (rear surface) of the wafer holder whose one surface (surface) is a wafer mounting surface. Incidentally, the wafer holder can be formed integrally with fine movement stage WFS, or can be fixed to main body section 81, for example, via an electrostatic chuck mechanism, a clamping mechanism, or by adhesion and the like. Or, grating RG and the transparent plate 81g can be integrally fixed to the back side of the wafer holder, and the wafer holder can be held by fine movement stage WFS. Incidentally, of the forming area of grating RG, in the case a part of the forming area spreads to the periphery of the wafer holder, it is desirable, for example, to provide a reflection member (e.g. a thin film and the like) which covers the forming area on one surface of cover glass 84 corresponding to the spread area, so that the measurement beam of the encoder system irradiated on grating RG does not pass through cover glass 84, or more specifically, so that the intensity of the measurement beam does not change greatly in the inside and the outside of the area on the rear surface of the wafer holder.

Besides this, the other surface of transparent plate 81g which has grating RG fixed or formed on one surface can be placed in contact or in proximity to the rear surface of the wafer holder and a protective member (cover glass 84) can also be provided on the one surface side of transparent plate 81g, or, the one surface of transparent plate 81g which has grating RG fixed or formed can be placed in contact or in proximity to the rear surface of the wafer holder, without having the protective member (cover glass 84) arranged. Especially in the former case, grating RG can be fixed to or formed on an opaque member such as ceramics instead of the transparent plate, or grating RG can be is fixed to or formed on the rear side of the wafer holder. Further, the wafer holder can be made of a solid glass member. And, this wafer holder can be mounted on the fine movement stage.

In the embodiment, in fine movement stage WFS, because a hollow section is formed inside main body section 81 (frame section FR) to decrease its weight, position controllability of fine movement stage WFS can be improved. In this case, a heat insulating material can be placed in the hollow section formed in main body section 81 (frame section FR) of fine movement stage WFS. This makes it possible to prevent any adverse effect that the heat generated in the fine movement stage drive system including the magnetic unit which will be described later in the pair of mover sections 82a and 82b has on grating RG.

Furthermore, on the upper surface (the upper surface of top plate 81u) of math body section 81 on the outer side of the wafer holder (mounting area of wafer W), as shown in FIGS. 2A, 2B, and 3, a plate (a liquid repellent plate) 83 is attached that has a circular opening one size larger than wafer W (the wafer holder) formed in the center, and also has an octagonal outer shape (contour) corresponding to top plate 81u. A liquid repellent treatment against liquid Lq is applied to the surface of plate 83 (a liquid repellent surface is formed). Plate 83 is set fixed to the upper surface of main body section 81 so that its entire surface (or a part of its surface) becomes substantially flush with the surface of wafer W. Further, in plate 83, a circular notch is formed in the vicinity of the +X end and the −Y side end as shown in FIG. 2B, and inside the notch, a measurement plate 86 is embedded in a state where its surface is substantially flush with the surface of plate 83, or more specifically, the surface of wafer W. On the surface of measurement plate 86, at least a pair of first fiducial marks detected by each of the pair of reticle alignment detection systems $RA_1$, and $RA_2$ and a second fiducial mark detected by wafer alignment system ALG are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86) surrounding the wafer holder.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating AG. Main body section 81 is formed so that the center area where grating RG is arranged is a plate whose thickness is substantially uniform.

On the upper surface of each of the extending sections on the +X side and the −X side of main body section 81 (bottom section 81*b*), spacers 85*a* and 85*b* having a projecting shape when sectioned are provided, with each of the projecting sections 89*a* and 89*b* extending outward in the Y-axis direction.

As shown in FIGS. 2A and 2B, mover section 82*a* includes two plate-like members 82*a*$_1$ and 82*a*$_2$ having a rectangular shape in a planar view whose size (length) in the Y-axis direction and size (width) in the X-axis direction are both shorter than stator section 93*a* (around half the size). These two plate-like members 82*a*$_1$ and 82*a*$_2$ are both fixed parallel to the XY plane, in a state set apart only by a predetermined distance in the Z-axis direction (vertically), via projecting section 89*a* of spacer 85*a* previously described, with respect to the end on the +X side in the longitudinal direction of main body section 81. In this case, the −X side end of plate-like member 82*a*$_2$ is clamped by spacer 85*a* and the extending section on the +X side of main body section 81. Between the two plate-like members 82*a*$_1$ and 82*a*$_2$, an end on the −X side of stator section 93*a* of coarse movement stage WCS is inserted in a non-contact manner. Inside plate-like members 82*a*$_1$ and 82*a*$_2$, magnet units MUa$_1$ and MUa$_2$ which will be described later are provided.

Mover section 82*b* includes two plate-like members 82*b*$_1$ and 82*b*$_2$ maintained at a predetermined distance from a spacer 85*b* in the Z-axis direction (vertically), and is configured in a similar manner with mover section 82*a*, although being symmetrical. Between the two plate-like members 82*b*$_1$ and 82*b*$_2$, an end on the +X side of stator section 93*b* of coarse movement stage WCS is inserted in a non-contact manner. Inside plate-like members 82*b*$_1$ and 82*b*$_2$, magnet units MUb$_1$ and MUb$_2$ are provided, which are configured similar to magnet units MUa$_1$ and MUa$_2$.

Now, as is previously described, because the surface on both sides in the Y-axis direction of coarse movement stage WCS is open, when attaching fine movement stage WFS to coarse movement stage WCS, the position of fine movement stage WFS in the Z-axis direction should be positioned so that stator section 93*a*, 93*b* are located between plate-like members 82*a*$_1$ and 82*a*$_2$, and 82*b*$_1$ and 82*b*$_2$, respectively, and then fine movement stage WFS can be moved (slid) in the Y-axis direction.

Next, a configuration of fine movement stage drive system 52 to drive fine movement stage WFS with respect to coarse movement stage WCS will be described. Fine movement stage drive system 52 includes the pair of magnet units MUa$_1$ and MUa$_2$ that mover section 82*a* previously described has, coil unit CUa that stator section 93*a* has, the pair of magnet units MUb$_1$ and MUb$_2$ that mover section 82*b* has, and coil unit CUb that stator section 93*b* has.

This will be explained further in detail. As it can be seen from FIGS. 5, 6A, and 6B, at the end on the −X side inside stator section 93*a*, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding 55*a* and a lower part winding 55*b* in a rectangular shape in a planar view that are disposed such that they overlap in the vertical direction (the Z-axis direction). Further, between the two lines of coil rows described above inside stator section 93*a*, an X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are placed equally spaced in the X-axis direction. Coil unit CUa is configured including the two lines of coil rows and X coil 56.

Incidentally, in the description below, while one of the stator sections 93*a* of the pair of stator sections 93*a* and 93*b* and mover section 82*a* supported by this stator section 93*a* will be described using FIGS. 5 to 7C, the other (the −X side) stator section 93*b* and mover section 82*b* will be structured similar to these sections and will function in a similar manner. Accordingly, coil unit CUb, magnet units MUb$_1$ and MUb$_2$ are structured similar to coil unit CUa, and magnet units MUa$_1$ and MUa$_2$.

Figure 5:
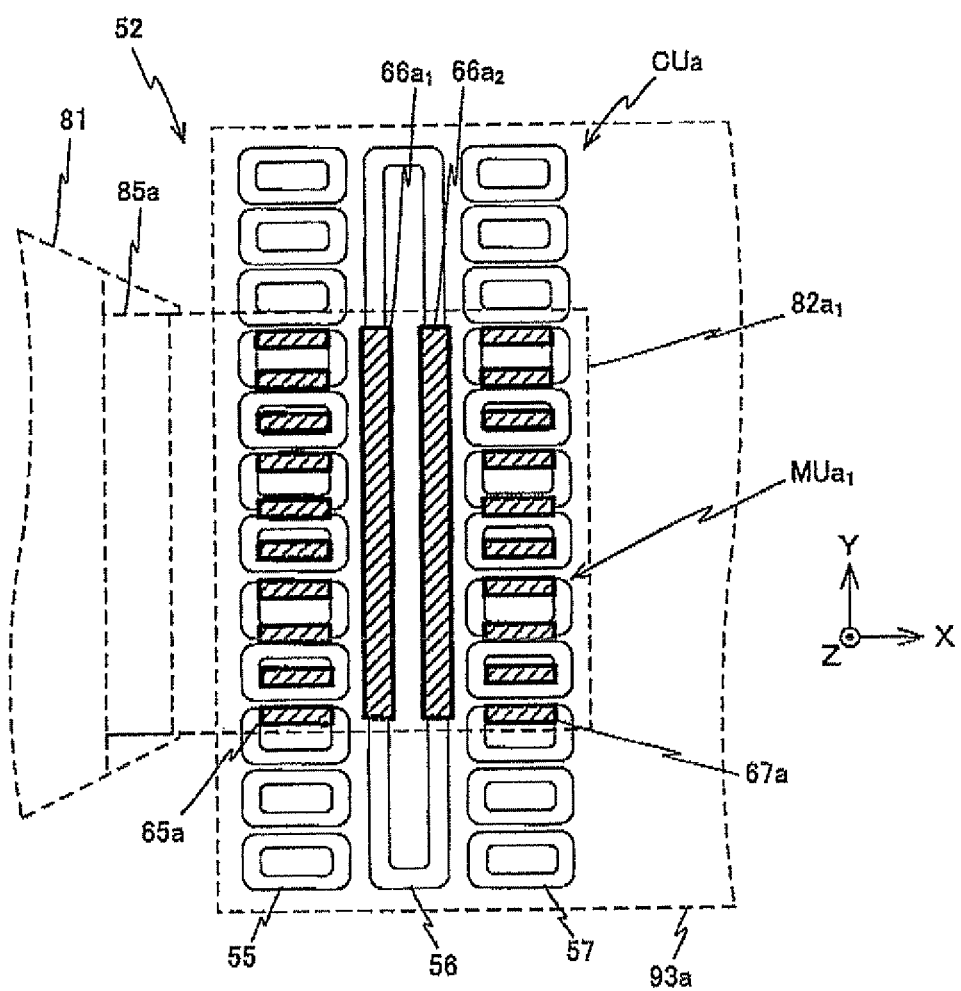
FIG. 5 is a planar view showing a placement of a magnet unit and a coil unit that structure a fine movement stage drive system.
Figure 6A:
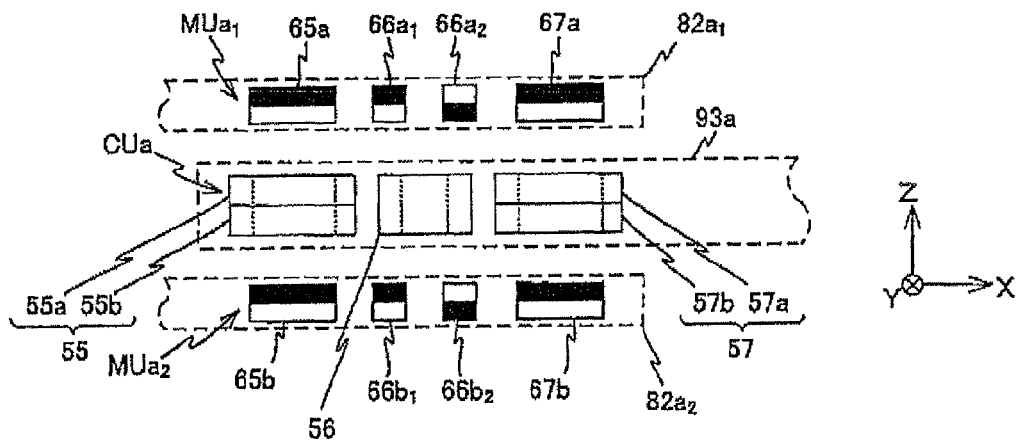
FIG. 6A is a side view showing a placement of a magnet unit and a coil unit that structure a fine movement stage drive system when viewed from the −Y direction.
Figure 6B:
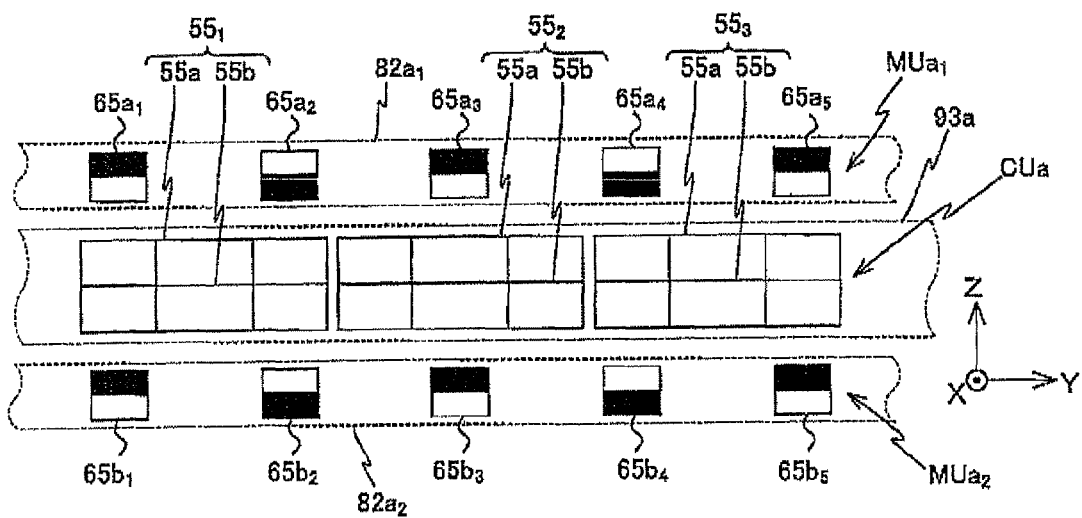
FIG. 6B is a side view showing a placement of a magnet unit and a coil unit that structure a fine movement stage drive system when viewed from the +X direction.

Inside plate-like member 82*a*$_1$ on the +Z side configuring a part of movable section 82*a* of fine movement stage WFS, as it can be seen when referring to FIGS. 5, 6A, and 6B, two lines of magnet rows are placed a predetermined distance apart in the X-axis direction, which are a plurality of (in this case, ten) permanent magnets 65*a* and 67*a* that have a rectangular shape in a planar view and whose longitudinal direction is in the X-axis direction. The two lines of magnet rows are placed facing coils 55 and 57, respectively.

As shown in FIG. 6B, the plurality of permanent magnets 65*a* are configured such that permanent magnets whose upper surface sides (+Z sides) are N poles and the lower surface sides (−Z sides) are S poles and permanent magnets whose upper surface sides (+Z sides) are S poles and the lower surface sides (−Z sides) are N poles are arranged alternately in the Y-axis direction. The magnet row consisting of the plurality of permanent magnets 67*a* is structured similar to the magnet row consisting of the plurality of permanent magnets 65*a*.

Further, between the two lines of magnet rows described above inside plate-like member 82*a*$_1$, a pair (two) of permanent magnets 66*a*$_1$ and 66*a*$_2$ whose longitudinal direction is in the Y-axis direction is placed set apart in the X axis direction, facing coil 56. As shown in FIG. 6A, permanent magnet 66*a*$_1$ is configured such that its upper surface side (+Z side) is an N pole and its lower surface side (−Z side) is an S pole, whereas with permanent magnet 66*a*$_2$, its upper surface side (+Z side) is an S pole and its lower surface side (−Z side) is an N pole.

Magnet unit MUa$_1$ is configured by the plurality of permanent magnets 65*a* and 67*a*, and 66*a*$_1$ and 66*a*$_2$ described above.

As shown in FIG. 6A, also inside plate-like member 82*a*$_2$ on the −Z side, permanent magnets 65*b*, 66*b*$_1$, 66*b*$_2$, and 67*b* are placed in a placement similar to plate-like member 82*a*$_1$ on the +Z side described above. Magnet unit MUa$_2$ is configured by these permanent magnets 65*b*, 66*b*$_1$, 66*b*$_2$, and 67*b*. Incidentally, in FIG. 5, permanent magnets 65*b*, 66*b*$_1$, 66*b*$_2$, and 67*b* inside plate-like members 82*a*2 on the −Z side are placed in the depth of the page surface, with permanent magnets 65*a*, 66*a*$_1$, 66*a*$_2$, and 67*a* placed on top.

Now, with fine movement stage drive system 52, as shown in FIG. 6B, positional relation (each distance) in the Y-axis direction between the plurality of permanent magnets 65 and the plurality of YZ coils 55 is set so that in the plurality of permanent magnets (in FIG. 6B, permanent magnets 65*a*$_1$ to 65*a*$_5$ which are sequentially arranged along the Y-axis direction) placed adjacently in the Y-axis direction, when two adjacent permanent magnets 65*a*$_1$ and 65*a*$_2$ each face the winding section of YZ coil 55$_1$, then permanent magnet 65*a*$_3$ adjacent to these permanent magnets does not face the winding section of YZ coil 55$_2$ adjacent to YZ coil 55$_1$ described above (so that permanent magnet 65*a*$_3$ faces the hollow center in the center of the coil, or faces a core, such as an iron core, to which the coil is wound). Incidentally, as shown in FIG. 6B, permanent magnets $65a_4$ and $65a_5$ each face the winding section of YZ coil $55_3$, which is adjacent to YZ coil $55_2$. The distance between permanent magnets $65b$, $67a$, and $67b$ in the Y-axis direction is also similar (refer to FIG. 6B).

Figure 7A:
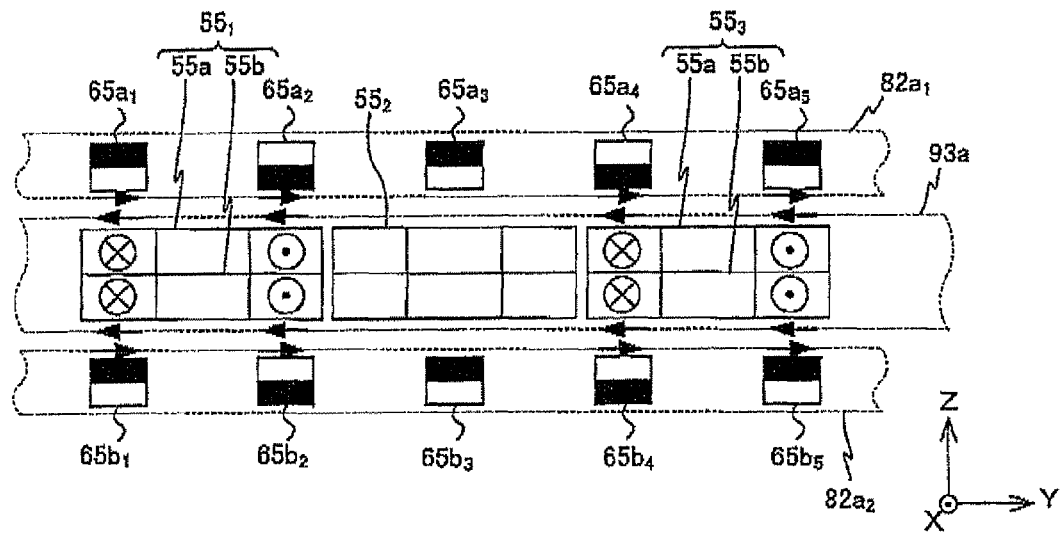
FIG. 7A is a view used to explain a drive principle when a fine movement stage is driven in the Y-axis direction.

Accordingly, in fine movement stage drive system 52, as an example, when a clockwise electric current when viewed from the +Z direction is supplied to the upper part winding and the lower part winding of coils $55_1$ and $55_5$, respectively, as shown in FIG. 7A in a state shown in FIG. 6B, a force (Lorentz force) in the −Y direction acts on coils $55_1$ and $55_3$, and as a reaction force, a force in the +Y direction acts on permanent magnets $65a$ and $65b$. By these action of forces, fine movement stage WFS moves in the +Y direction with respect to coarse movement stage WCS. When a counterclockwise electric current when viewed from the +Z direction is supplied to each of the coils $55_1$ and $55_3$ conversely to the case described above, fine movement stage WFS moves in the −Y direction with respect to coarse movement stage WCS.

By supplying an electric current to coil 57, electromagnetic interaction is performed with permanent magnet 67 ($67a$, $67b$) and fine movement stage WFS can be driven in the Y-axis direction. Main controller 20 controls the position of fine movement stage WFS in the Y-axis direction by controlling the current supplied to each coil.

Figure 7B:
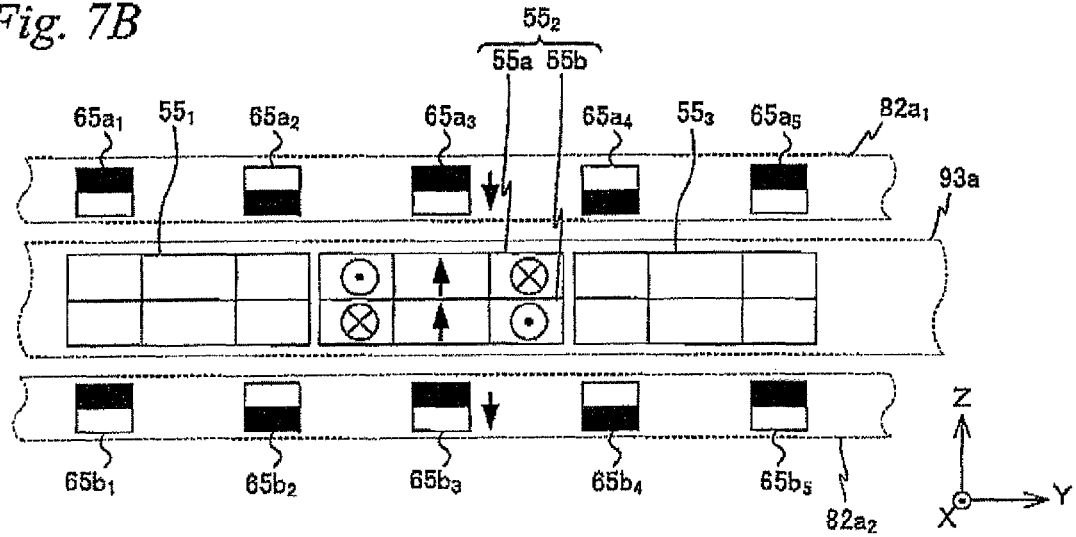
FIG. 7B is a view used to explain a drive principle when a fine movement stage is driven in the Z-axis direction.

Further, in fine movement stage drive system 52, as an example, when a counterclockwise electric current when viewed from the +Z direction is supplied to the upper part winding of coil $55_2$ and a clockwise electric current when viewed from the +Z direction is supplied to the lower part winding as shown in FIG. 7B in a state shown in FIG. 6B, an attraction force is generated between coil $55_2$ and permanent magnet $65a_3$ whereas a repulsive force (repulsion) is generated between coil $55_2$ and permanent magnet $65B_3$, respectively, and by these attraction force and repulsive force, fine movement stage WFS is moved upward (+Z direction) with respect to coarse movement stage WSC, or more particularly, moved in a direction of levitation. Main controller 20 controls the position of fine movement stage WFS in the Z direction which is in a levitated state by controlling the current supplied to each coil.

Figure 7C:
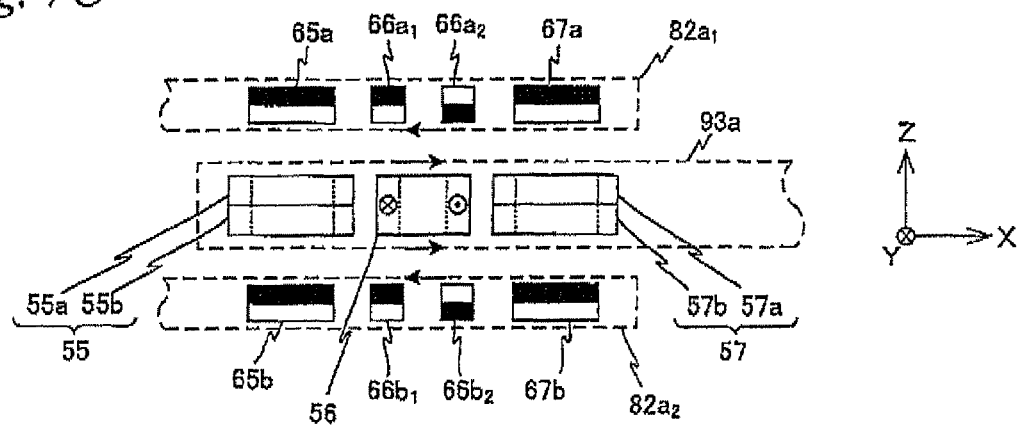
FIG. 7C is a view used to explain a drive principle when a fine movement stage is driven in the X-axis direction.

Further, in a state shown in FIG. 6A, when a clockwise electric current when viewed from the +Z direction is supplied to coil 56, a force in the +X direction acts on coil 56 as shown in FIG. 7C, and as its reaction, a force in the −X direction acts on permanent magnets $66a_1$ and $66a_2$, and $66b_1$ and $66b_2$, respectively, fine movement stage WFS is moved in the −X direction with respect to coarse movement stage WSC. Further, when a counterclockwise electric current when viewed from the +Z direction is supplied to coil 56 conversely to the case described above, a force in the +X direction acts on permanent magnets $66a_1$ and $66a_2$, and $66b_1$ and $66b_2$ and fine movement stage WFS is moved in the +X direction with respect to coarse movement stage WCS. Main controller 20 controls the position of fine movement stage WFS in the X-axis direction by controlling the current supplied to each coil.

As is obvious from the description above, in the embodiment, main controller 20 drives fine movement stage WFS in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS in the Y-axis direction, main controller 20 generates a drive force in the Z-axis direction separately from the drive force in the Y-axis direction and makes fine movement stage WFS levitate from coarse movement stage WCS. And, main controller 20 drives fine movement stage WFS in the Y-axis direction while maintaining the levitated state of fine movement stage WFS with respect to coarse movement stage WCS, namely a noncontact state, by sequentially switching the coil subject to current supply according to the position of fine movement stage WFS in the Y-axis direction. Further, main controller 20 can also drive fine movement stage WFS independently in the X-axis direction along with the Y-axis direction, in a state where fine movement stage WFS is levitated from coarse movement stage WCS.

Figure 8A:
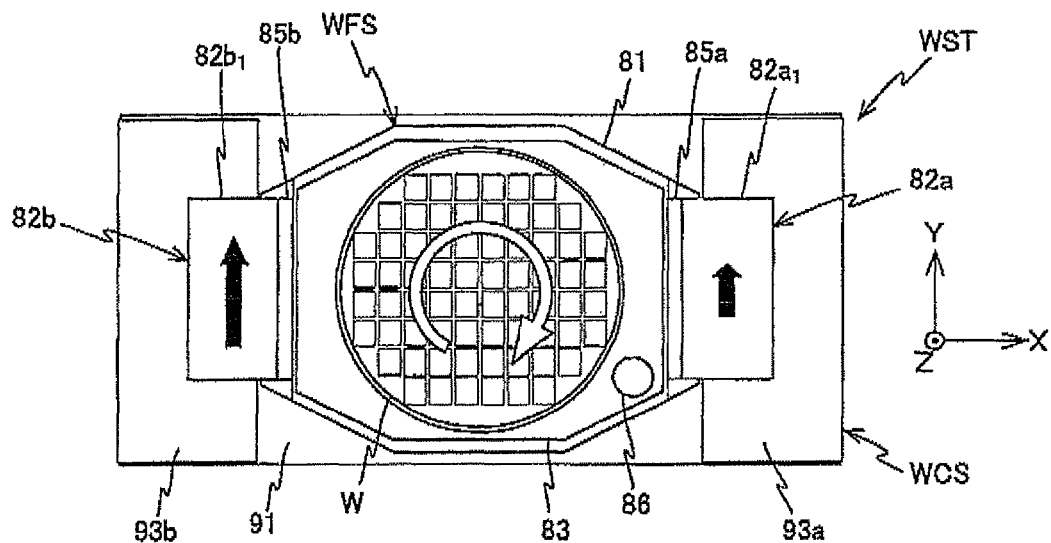
FIG. 8A is a view used to explain an operation when a fine movement stage is rotated around the Z-axis with respect to a coarse movement stage.

Further, as shown in FIG. 8A, for example, main controller 20 can make fine movement stage WFS rotate around the Z-axis (θz rotation) (refer to the outlined arrow in FIG. 8A), by applying a drive force (thrust) in the Y-axis direction having a different magnitude to both mover section $82a$ on the +X side and mover section $82b$ on the −X side of fine movement stage WFS (refer to the black arrows in FIG. 8A). Incidentally, in contrast with FIG. 8A, by making the drive force applied to mover section $82a$ on the +X side larger than the −X side, fine movement stage WFS can be made to rotate counterclockwise with respect to the Z-axis.

Figure 8B:
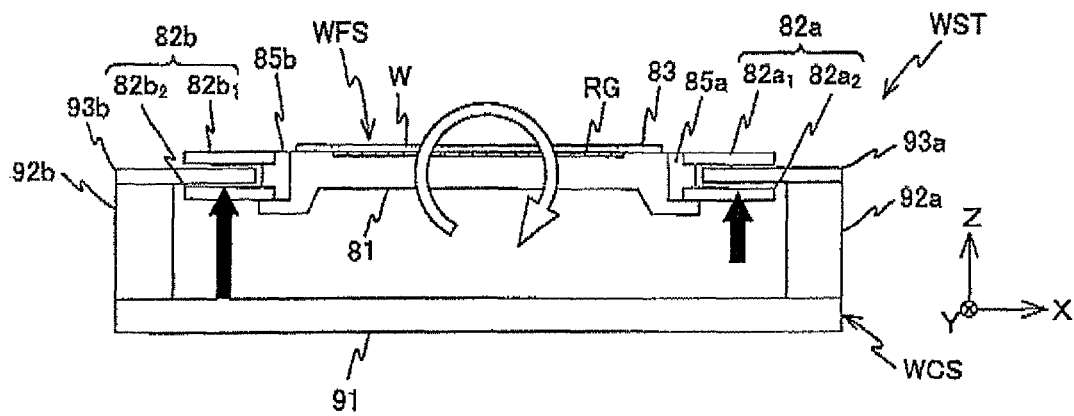
FIG. 8B is a view used to explain an operation when a fine movement stage is rotated around the Y-axis with respect to a coarse movement stage.

Further, as shown in FIG. 8B, main controller 20 can make fine movement stage WFS rotate around the Y-axis (θy drive) (refer to the outlined arrow in FIG. 8B), by applying a different levitation force (refer to the black arrows in FIG. 8B) to both mover section $82a$ on the +X side and mover section $82b$ on the −X side of fine movement stage WFS. Incidentally, in contrast with FIG. 8B, by making the levitation force applied to mover section $82a$ on the +X side larger than the −X side, fine movement stage WFS can be made to rotate counterclockwise with respect to the Y-axis.

Figure 8C:
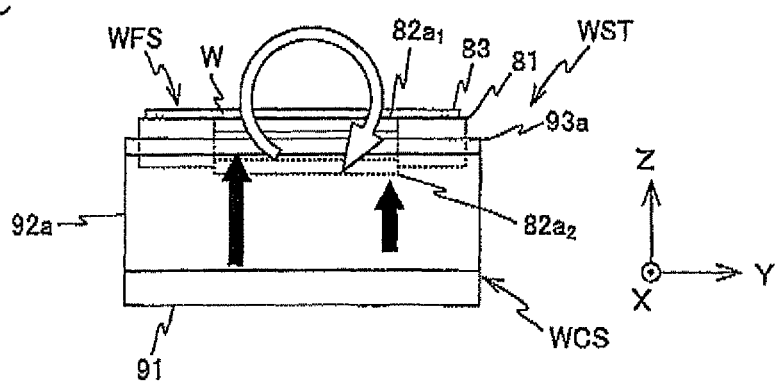
FIG. 8C is a view used to explain an operation when a fine movement stage is rotated around the X-axis with respect to a coarse movement stage.

Furthermore, as shown in FIG. 8C, for example, main controller 20 can make fine movement stage WFS rotate around the X-axis (θx drive) (refer to the outlined arrow in FIG. 8C), by applying a different levitation force to both mover sections $82a$ and $82b$ of fine movement stage WFS on the + side and the − side in the Y-axis direction (refer to the black arrows in FIG. 8C). Incidentally, in contrast with FIG. 8C, by making the levitation force applied to mover section $82a$ (and $82b$) on the −Y side smaller than the levitation force on the +Y side, fine movement stage WFS can be made to rotate counterclockwise with respect to the X-axis.

As it can be seen from the description above, in the embodiment, fine movement stage drive system 52 supports fine movement stage WFS by levitation in a non-contact state with respect to coarse movement stage WCS, and can also drive fine movement stage WFS in a non-contact manner in directions of six degrees of freedom (X, Y, Z, θx, θy, θz) with respect to coarse movement stage WCS.

Figure 9:
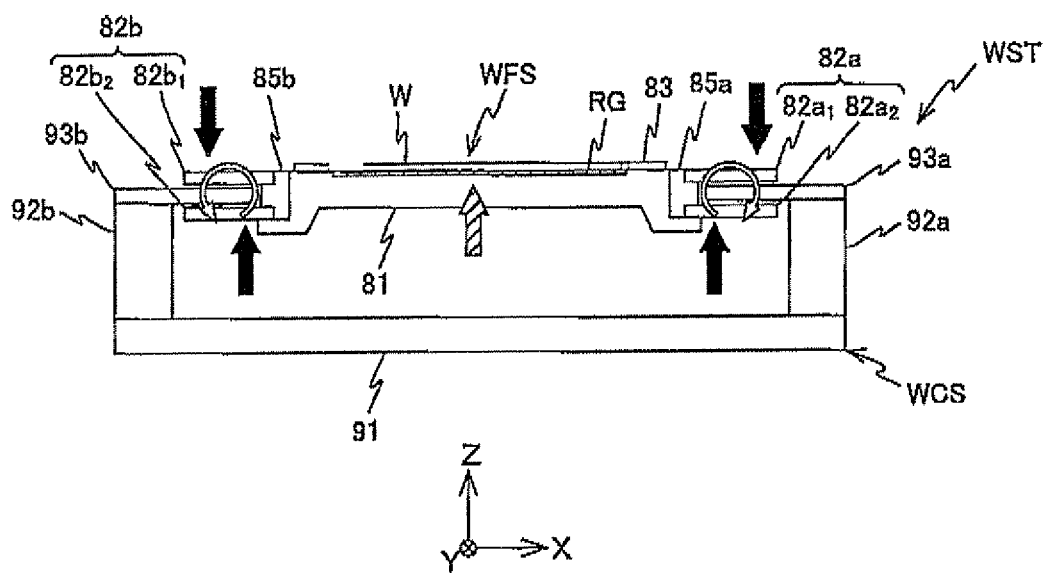
FIG. 9 is a view used to explain an operation when a center section of the fine movement stage is deflected in the +Z direction.

Further, in the embodiment, by supplying electric current to the two lines of coils 55 and 57 (refer to FIG. 5) placed inside stator section $93a$ in directions opposite to each other when applying the levitation force to fine movement stage WFS, for example, main controller 20 can apply a rotational force (refer to the outlined arrows in FIG. 9) around the Y-axis simultaneously with the levitation force (refer to the black arrows in FIG. 9) with respect to mover section $82a$, as shown in FIG. 9. Similarly, by supplying electric current to the two lines of coils 55 and 57 placed inside stator section $93b$ in directions opposite to each other when applying the levitation force to fine movement stage WFS, for example, main controller 20 can apply a rotational force around the Y-axis simultaneously with the levitation force with respect to mover section $82b$.

More specifically, in the embodiment, coil unit CUa, and magnet units $MUa_1$ and $MUa_2$ configuring a part of fine movement stage drive system 52 constitute a first drive section which applies a drive force in each of the Y-axis direction, the X-axis direction, the Z-axis direction, the θy direction, and the θx direction, to an end on the +X side of fine movement stage WFS, whereas, coil unit CUb, and magnet units $MUb_1$ and $MUb_2$ configuring a part of fine movement stage drive system 52 constitute a second drive section which applies a drive force in each of the Y-axis direction, the X-axis direction, the Z-axis direction, the θy direction, and the θx direction, to an end on the −X side of fine movement stage WFS.

Further, by applying a rotational force around the Y-axis (a force in the θy direction) to each of the pair of mover sections 82a and 82b in directions opposite to each other via the first and second drive sections described above, main controller 20 can deflect the center in the X-axis direction of fine movement stage WFS in the +Z direction or the −Z direction (refer to the hatched arrow in FIG. 9). Accordingly, as shown in FIG. 9, by bending the center in the X-axis direction of fine movement stage WFS in the +Z direction (in a convex), the deflection in the middle part of fine movement stage WFS (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS also becomes large.

Further, when wafer W is deformed by its own weight and the like, in the irradiation area (exposure area IA) of illumination light IL, there is a risk that the surface of wafer W mounted on fine movement stage WFS will no longer be within the range of a depth of focus of projection optical system PL. Therefore, main controller 20 can apply a rotational force around the Y-axis to each of the pair of mover sections 82a and 82b in directions opposite to each other via the first and second drive sections, similar to the case described above where the center in the X-axis direction of fine movement stage WFS is bent in the in the +Z direction, so that wafer W is deformed to be substantially flat, and the surface of wafer W falls within the range of the depth of focus of projection optical system PL in exposure area IA. Incidentally, while FIG. 9 shows an example where fine movement stage WFS is bent in the +Z direction (a convex shape), fine movement stage WFS can also be bent in a direction opposite to this (a concave shape) by controlling the direction of the electric current supplied to the coils.

In exposure apparatus 100 of the embodiment, at the time of exposure operation by the step-and-scan method to wafer W, positional information (including the positional information in the θz direction) in the XY plane of fine movement stage WFS is measured by main controller 20 using encoder system 73 (refer to FIG. 4) of fine movement stage position measurement system 70 which will be described later on. Further, relative positional information (including relative positional information in the θz direction) in the XY plane between fine movement stage WFS and coarse movement stage WCS is measured by main controller 20, using a relative stage position measurement system 17 (refer to FIG. 4) which will be described later on. The positional information of fine movement stage WFS and the relative positional information between fine movement stage WFS and coarse movement stage WCS are sent to main controller 20, which controls the position of fine movement stage WFS and coarse movement stage WCS based on these positional information.

On the other hand, when wafer stage WST is located outside the measurement area of fine movement stage position measurement system 70, the positional information of wafer stage WST is measured by main controller 20 using wafer stage position measurement system 16 (refer to FIG. 4). As shown in FIG. 1, wafer stage position measurement system 16 includes a laser interferometer which irradiates a measurement beam on a reflection surface formed on the coarse movement stage WCS side surface by mirror-polishing and measures positional information (including rotational information in the θz direction) of wafer stage WST in the XY plane. Incidentally, although illustration is omitted in FIG. 1, in actual practice, a Y reflection surface perpendicular to the Y-axis and an X reflection surface perpendicular to the X-axis are formed on coarse movement stage WCS, and corresponding to these surfaces, an X interferometer and a Y interferometer are provided as the laser interferometer that irradiate measurement beams, respectively, on to the X reflection surface and the Y reflection surface. Incidentally, in wafer stage position measurement system 16, for example, the Y interferometer can have a plurality of measurement axes, and positional information (rotational information) in the θz direction of wafer stage WST can also be measured, based on an output of each of the measurement axes. Incidentally, the positional information of wafer stage WST in the XY plane can be measured using other measurement devices, such as for example, an encoder system, instead of wafer stage position measurement system 16 described above. In this case, for example, a two-dimensional scale can be placed on the upper surface of base board 12, and an encoder head can be arranged on the bottom surface of coarse movement stage WCS.

Next, a configuration of fine movement stage position measurement system 70 (refer to FIG. 4) including encoder system 73 used to measure the positional information of fine movement stage WFS in the XY plane and laser interferometer system 75 used to measure the positional information of fine movement stage WFS in the Z, θx, and θy directions will be described below. As shown in FIG. 1, fine movement stage position measurement system 70 is equipped with a measurement member (measurement arm) 71 which is inserted in a space inside the coarse movement stage in a state where wafer stage WST is placed below projection optical system PL. Measurement arm 71 is supported cantilevered (supported in the vicinity of one end) from main frame BD of exposure apparatus 100 via a support section 72. Incidentally, in the case a configuration is employed where the measurement members do not interfere with the movement of the wafer stage, the configuration is not limited to the cantilever support, and both ends in the longitudinal direction can be supported.

Measurement arm 71 is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of the same material that transmits light, such as, for example, a glass member affixed in plurals. Measurement arm 71 is formed solid, except for the portion where the encoder head (an optical system) which will be described later is housed. In the state where wafer stage WST is placed below projection optical system PL as previously described, the tip of measurement arm 71 is inserted into the space of coarse movement stage WCS, and its upper surface faces the lower surface (to be more precise, the lower surface of main body section 81 (not shown in FIG. 1, refer to FIG. 2A and the like) of fine movement stage WFS as shown in FIG. 1. The upper surface of measurement arm 71 is placed almost parallel with the lower surface of fine movement stage WFS, in a state where a predetermined clearance, such as, for example, around several mm, is formed with the lower surface of fine movement stage WFS. Incidentally, the clearance between the upper surface of measurement arm 71 and the lower surface of fine movement stage WFS can be more than or less than several mm.

As shown in FIG. 4, fine movement stage position measurement system 70 is equipped with encoder system 73 which measures the position of fine movement stage WFS in the X-axis direction, the Y-axis direction, and the θz direction, and laser interferometer system 75 which measures the position of fine movement stage WFS in the Z-axis direction, the θx direction, and the θy direction. Encoder system 73 includes an X linear encoder 73x measuring the position of fine movement stage WFS in the X-axis direction, and a pair of Y linear encoders 73ya and 73yb (hereinafter, also appropriately referred to together as Y linear encoder 73y) measuring the position of fine movement stage WFS in the Y-axis direction. In encoder system 73, a head of a diffraction interference type is used that has a configuration similar to an encoder head (hereinafter shortly referred to as a head) disclosed in, for example, U.S. Pat. No. 7,238,931, and PCT International Publication No. 2007/083758 (the corresponding U.S. Patent Application Publication No. 2007/288121) and the like. However, in the embodiment, a light source and a photodetection system (including a photodetector) of the head are placed external to measurement arm 71 as in the description later on, and only an optical system is placed inside measurement arm 71, or more specifically, facing grating RG. Hereinafter, the optical system placed inside measurement arm 71 will be referred to as a head, besides the case when specifying is especially necessary.

Figure 10A:
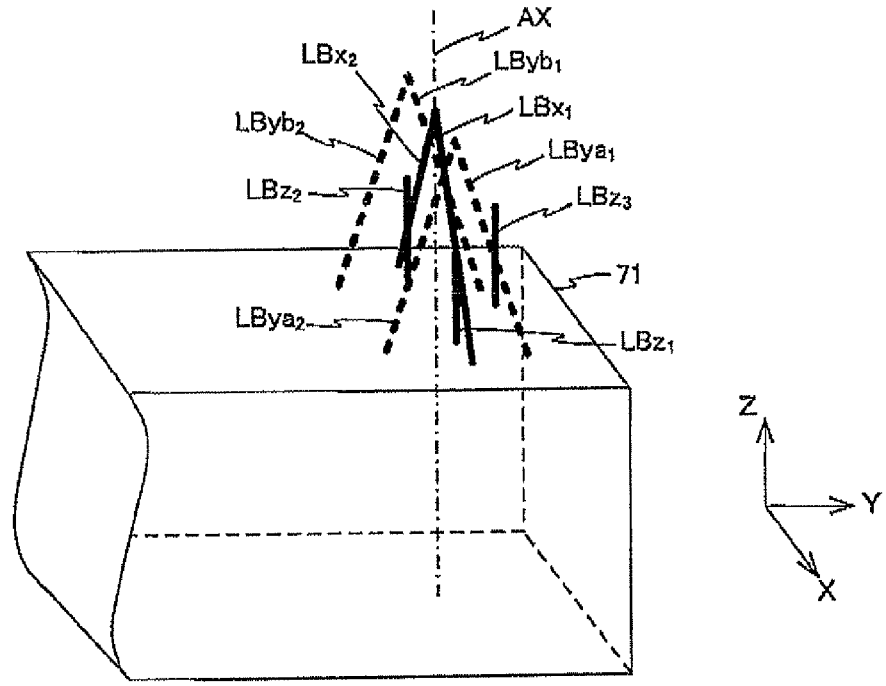
FIG. 10A shows a perspective view of a tip of a measurement arm.
Figure 10B:
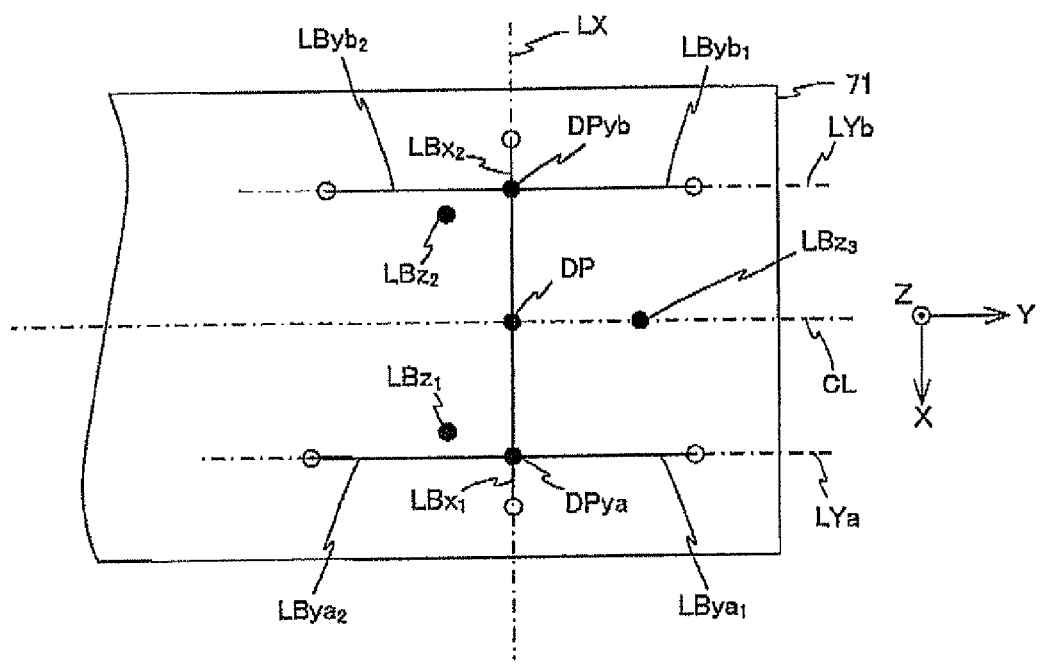
FIG. 10B is a planar view when viewed from the +Z direction of an upper surface of the tip of the measurement arm.

FIG. 10A shows a tip of measurement arm 71 in a perspective view, and FIG. 10B shows an upper surface of the tip of measurement arm 71 in a planar view when viewed from the +Z direction. Encoder system 73 measures the position of fine movement stage WFS in the X-axis direction using one X head 77x (refer to FIGS. 11A and 11B), and the position in the Y-axis direction using a pair of Y heads 77ya and 77yb (refer to FIG. 11B). More specifically, X linear encoder 73x previously described is configured by X head 77x which measures the position of fine movement stage WFS in the X-axis direction using an X diffraction grating of grating RG, and the pair of Y linear encoders 73ya and 73yb is configured by the pair of Y heads 77ya and 77yb which measures the position of fine movement stage WFS in the Y-axis direction using a Y diffraction grating of grating RG.

Figure 11A:
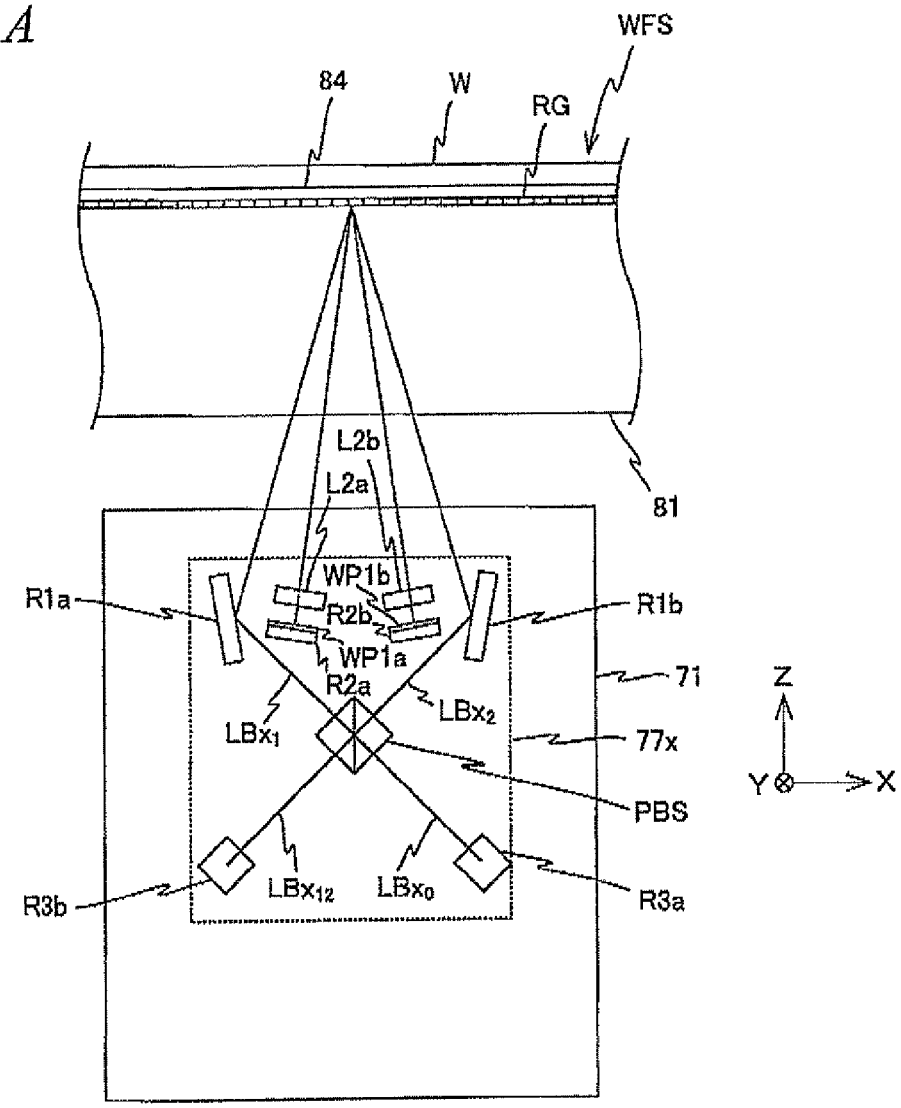
FIG. 11A is a view showing a rough configuration of a X head 77x.

A configuration of three heads 77x, 77ya, and 77yb which configure encoder system 73 will now be described. FIG. 11A representatively shows a rough configuration of X head 77x, which represents three heads 77x, 77ya, and 77yb. Further, FIG. 11B shows a placement of each of the X head 77x, and Y heads 77ya and 77yb within measurement arm 71.

As shown in FIG. 11A, X head 77x is equipped with a polarization beam splitter FBS whose separation plane is parallel to the YZ plane, a pair of reflection mirrors R1a and R1b, lenses L2a and L2b, quarter wavelength plates (hereinafter, described as a λ/4 plate) WP1a and WP1b, refection mirrors R2a and R2b, and refection mirrors R1a and R3b and the like, and these optical elements are placed in a predetermined positional relation. Y heads 77ya and 77yb also have an optical system with a similar structure. As shown in FIGS. 11A and 11B, X head 77x, and Y heads 77ya and 77yb are unitized, and each fired inside of measurement arm 71.

Figure 11B:
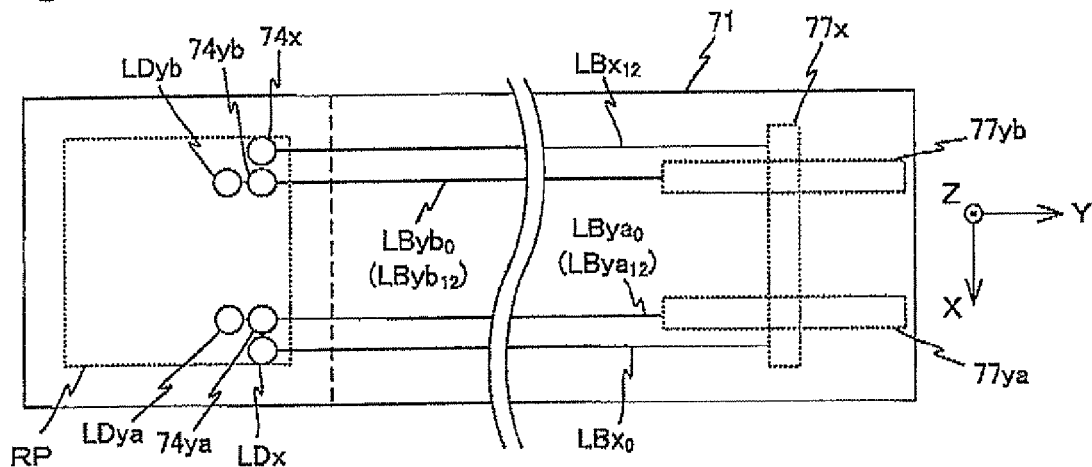
FIG. 11B is a view used to explain a placement of each of the X head 77x, Y heads 77ya and 77yb inside the measurement arm.

As shown in FIG. 11B, in X head 77x (X encoder 73x), a laser beam $LBx_0$ is emitted in the −Z direction from a light source LDx provided on the upper surface (or above) at the end on the −Y side of measurement arm 71, and its optical path is bent to become parallel with the Y-axis direction via a reflection plane RP which is provided on a part of measurement arm 71 inclined at an angle of 45 degrees with respect to the XY plane. This laser beam $LBx_0$ travels through the solid section inside measurement arm 71 in parallel with the longitudinal direction (the Y-axis direction) of measurement arm 71, and reaches reflecting mirror R3a shown in FIG. 11A. Then, the optical path of laser beam $LBx_0$ is bent by reflecting mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS, via reflection mirror R1a, and measurement beam $LBx_2$ reflected off polarization beam splitter PBS reaches grating RG via reflection mirror R1b. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WP1b again and reach polarization beam splitter PBS by tracing the same optical path in the reversed direction.

The polarization direction of each of the two first-order diffraction beams that have reached polarization beam splitter PBS is rotated at an angle of 90 degrees with respect to the original direction. Therefore, the first-order diffraction beam of measurement beam $LBx_1$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. Accordingly, the first-order diffraction beams of each of the measurement beams $LBx_1$ and $LBx_2$ are coaxially synthesized as a synthetic beam $LBx_{12}$. Synthetic beam $LBx_{12}$ has its optical path bent by reflecting mirror R3b so it becomes parallel to the Y-axis, travels inside measurement arm 71 parallel to the Y-axis, and then is sent to an X photodetection system 74x provided on the upper surface (or above) at the end on the −Y side of measurement arm 71 shown in FIG. 11B via reflection plane RP previously described.

In X photodetection system 74x, the polarization direction of the first-order diffraction beams of measurement beams $LBx_1$ and $LBx_2$ synthesized as synthetic beam $LBx_{12}$ is arranged by a polarizer (analyzer) (not shown) and the beams interfere with each other so as to form an interference light, which is detected by the photodetector and is converted into an electric signal in accordance with the intensity of the interference light. When fine movement stage WFS moves in the measurement direction (in this case, the X-axis direction) here, a phase difference between the two beams changes, which changes the intensity of the interference light. This change of the intensity of the interference light is supplied to main controller 20 (refer to FIG. 4) as positional information related to the X-axis direction of fine movement stage WFS.

As shown in FIG. 11B, laser beams $LBya_0$ and $LByb_0$, which are emitted from light sources LDya and LDyb, respectively, and whose optical paths are bent by an angle of 90 degrees so as to become parallel to the Y-axis by reflection plane RP previously described, are incident on Y heads 77ya and 77yb, and similar to the previous description, synthetic beams LBya$_{12}$ and LByb$_{12}$ of the first-order diffraction beams by grating RG (Y diffraction grating) of each of the measurement beams split by polarization by the polarization beam splitter are output from Y heads 77ya and 77yb, respectively, and return to Y photodetection system 74ya, 74yb. Now, laser beams LByb$_0$ and LByb$_0$ emitted from light sources LDya and LDyb, and synthetic beams LBya$_{12}$ and LByb$_{12}$ returning to Y photodetection systems 74ya and 74yb, each pass an optical path which are overlaid in a direction perpendicular to the page surface of FIG. 11B. Further, as described above, in Y heads 77ya and 77yb, optical paths are appropriately bent (omitted in drawings) inside so that laser beams LBya$_0$ and LByb$_0$ emitted from the light source and synthetic beams LBya$_{12}$ and LByb$_{12}$ returning to Y photodetection systems 74ya and 74yb pass optical paths which are parallel and distanced apart in the z-axis direction.

As shown in FIGS. 10A and 103, X head 77x irradiates measurement beams LBx$_1$ and LBx$_2$ (indicated by a solid line in FIG. 10A) on grating RG from two points (refer to the white circles in FIG. 10B) on a straight line LX parallel to the X-axis that are at an equal distance from a center line CL of measurement arm 71. Measurement beams LBx$_1$ and LBx$_2$ are irradiated on the same irradiation point on grating RG (refer to FIG. 11A). The irradiation point of measurement beams LBx$_1$ and LBx$_2$, that is, a detection point of X head 77x (refer to reference code DP in FIG. 10B) coincides with an exposure position which is the center of an irradiation area (exposure area) IA of illumination light IL irradiated on wafer W (refer to FIG. 1). Incidentally, while measurement beams LBx$_1$ and LBx$_2$ are actually refracted at a boundary and the like of main body section 81 and an atmospheric layer, it is shown simplified in FIG. 11A and the like.

As shown in FIG. 11B, each of the pair of Y heads 77ya and 77yb are placed on the +X side and the −X side of center line CL of measurement arm 71. As shown in FIGS. 10A and 10B, Y head 77ya is placed on a straight line LYa which is parallel to the Y-axis, and irradiates measurement beams LBya$_1$ and LBya$_2$ that are each shown by a broken line in FIG. 10A on a common irradiation point on grating RG from two points (refer to the white circles in FIG. 10B) which are distanced equally from straight line LX. The irradiation point of measurement beams LBya$_1$ and LBya$_2$, that is, a detection point of Y head 77ya is shown by reference code DPya in FIG. 10B.

Similar to Y head 77ya, Y head 77yb is placed on a straight lire LYb which is located the same distance away from center line CL of measurement arm 71 as straight line LYa and is parallel to the Y-axis, and irradiates measurement beams LByb$_1$ and LByb$_2$ on a common irradiation point DPyb on grating RG from two points (refer to the white circles in FIG. 10B) which are distanced equally from straight line LX. As shown in FIG. 10B, detection points DPya and DPyb of each of the measurement beams LBya$_1$ and LBya$_2$, and measurement beams LByb$_1$ and LByb$_2$ are placed on straight line LX which is parallel to the X-axis. Now, main controller 20 determines the position of fine movement stage WFS in the Y-axis direction, based on an average of the measurement values of the two Y heads 77ya and 77yb. Accordingly, in the embodiment, the position of fine movement stage WFS in the Y-axis direction is measured with a midpoint of detection points DPya and DPyb serving as a substantial measurement point. And, the midpoint of detection points DPya and DPyb according to Y heads 77ya and 77yb coincides with irradiation point DP of measurement beams LBx$_1$ and LBX$_2$ on grating RG. More specifically, in the embodiment, there is a common detection point regarding measurement of positional information of fine movement stage WFS in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS in the XY plane, directly under (at the back side of) the exposure position when transferring a pattern of reticle R on a predetermined shot area of wafer W mounted on fine movement stage WFS. Further, main controller 20 measures a rotational amount of fine movement stage WFS in the θz direction, based on a difference of the measurement values of the pair of Y heads 77ya and 77yb, which are placed apart in the X-axis direction and measure the position of fine movement stage WFS in the Y-axis direction, respectively.

As shown in FIG. 10A, laser interferometer system 75 makes three measurement beams LBz$_1$, LBz$_2$, and LBz$_3$ enter the lower surface of fine movement stage WFS from the tip of measurement arm 71. Laser interferometer system 75 is equipped with three laser interferometers 75a to 75c (refer to FIG. 4) that irradiate three measurement beams LBz$_1$, LBz$_2$, and LBz$_3$, respectively.

In laser interferometer system 75, three measurement beams LBz$_1$, LBz$_2$, and LBz$_3$ are emitted in parallel with the Z-axis from each of the three points that are not collinear on the upper surface of measurement arm 71, as shown in FIGS. 10A and 10B. Now, as shown in FIG. 10B, three measurement beams LBz$_2$, LBz$_2$, and LBz$_3$ are each irradiated from positions which are the apexes of an isosceles triangle (or an equilateral triangle) whose centroid coincides with the exposure position which is the center of irradiation area (exposure area) IA. In this case, the outgoing point (irradiation point) of measurement beam LBz$_3$ is located on center line CL, and the outgoing points (irradiation points) of the remaining measurement beams LBz$_1$ and LBz$_2$ are equidistant from center line CL. In the embodiment, main controller 20 measures the position in the Z-axis direction, and information on the rotational amount in the θz direction and the θy direction of fine movement stage WFS, using laser interferometer system 75. Incidentally, laser interferometers 75a to 75c are provided on the upper surface (or above) at the end on the −Y side of measurement arm 71. Measurement beams LBz$_1$, LBz$_2$, and LBz$_3$ emitted in the −Z direction from laser interferometers 75a to 75c travel within measurement arm 71 along the Y-axis direction via reflection plane RP previously described, and each of their optical paths is bent so that the beams are emitted from the three points described above.

In the embodiment, on the lower surface of fine movement stage WFS, a wavelength selection filter (omitted in drawings) which transmits each measurement be from encoder system 73 and blocks the transmission of each measurement beam from laser interferometer system 75 is provided. In this case, the wavelength selective filter also serves as a reflection surface for each of the measurement beams from laser interferometer system 75. As the wavelength selection filter, a thin film and the like having wavelength-selectivity is used, and in the embodiment, the filter is provided, for example, on one surface of transparent plate 81g, and grating RG is placed on the wafer holder side with respect to the one surface.

As it can be seen from the description so far, main controller 20 can measure the position of fine movement stage WFS in directions of six degrees of freedom by using encoder system 73 and laser interferometer system 75 of fine movement stage position measurement system 70. In this case, since the optical path lengths in the air of the measurement beams are extremely short and also are almost equal to each other in encoder system 73, the influence of air fluctuation can mostly be ignored. Accordingly, by encoder system 73, positional information (including the θz direction) of fine movement stage WFS within the XY plane can be measured with high accuracy. Further, because the substantial detection points on the grating in the X-axis direction and the Y-axis direction by encoder system 73 and detection points on the lower surface of fine movement stage WFS lower surface in the Z-axis direction by laser interferometer system 75 coincide with the center (exposure position) of exposure area IA, respectively, generation of the so-called Abbe error is suppressed to a substantially ignorable degree. Accordingly, by using fine movement stage position measurement system 70, main controller 20 can measure the position of fine movement stage WFS in the X-axis direction, the Y-axis direction, and the Z-axis direction with high precision, without any Abbe errors.

Next, relative stage position measurement system 17 (refer to FIG. 4), which is used for measuring the relative positional information between fine movement stage WFS and coarse movement stage WCS, will be described. Relative stage position measurement system 17 is configured of a first encoder system 17a and a second encoder system 17b.

Figure 12:
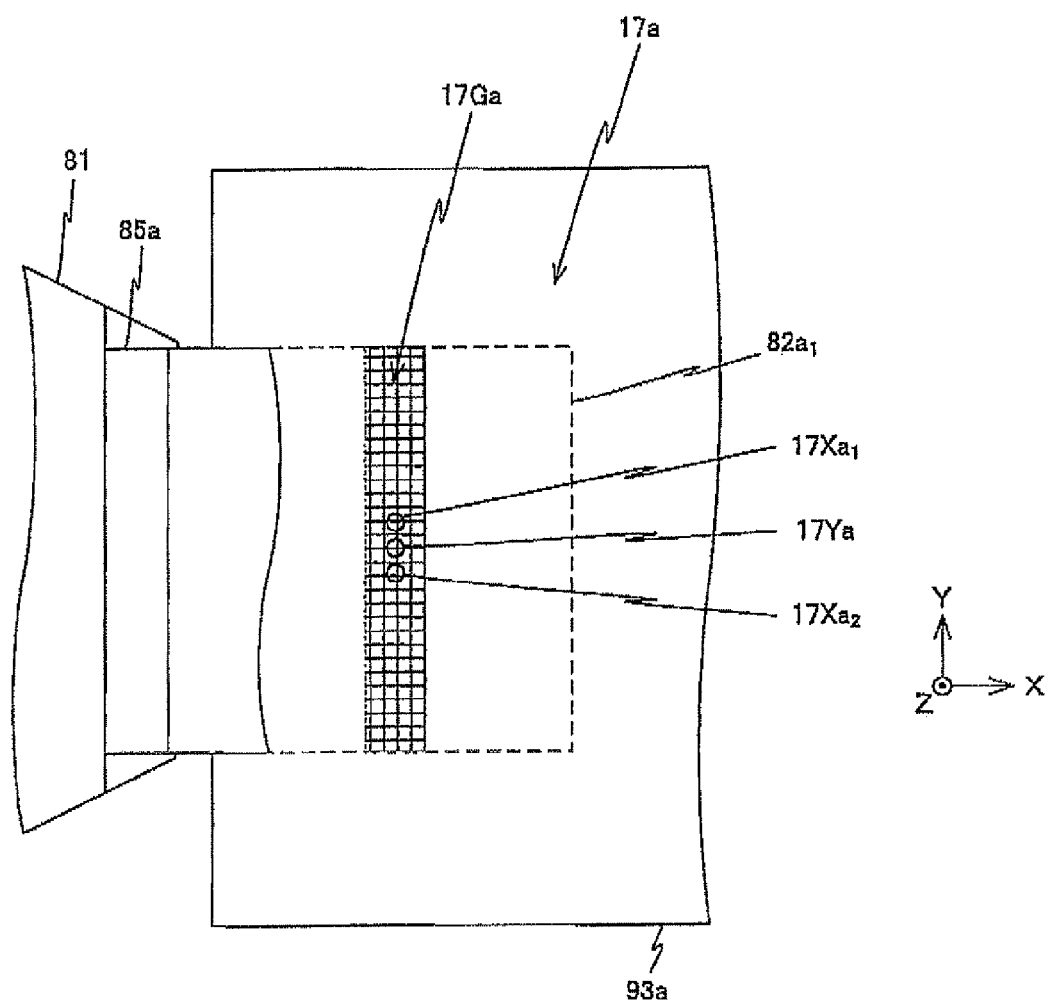
FIG. 12 is a planar view (No. 1) showing a placement of an encoder head and a scale configuring a relative stage position measurement system.

FIG. 12 shows a placement of three encoder heads $17Xa_1$, $17Xa_2$, $17Ya$ and a grating 17Ga configuring the first encoder system 17a. Here, grating RG is a two-dimensional grating including a reflection diffraction grating (X diffraction grating) whose periodic direction is in the X-axis direction, and a reflection grating (Y diffraction grating) whose periodic direction is in the Y-axis direction.

As shown in FIG. 12, grating 17Ga is placed on the −Z surface (of plate-like member $82a_1$) of mover section 82a fixed to the +X end of fine movement stage WFS (main body section 81). Grating 17Ga has a rectangle tabular shape whose longitudinal direction is in the Y-axis direction. Here, the length of grating 17Ga in the Y-axis direction, for example, is approximately equal to (slightly shorter than) the length of plate-like member $82a_1$. Meanwhile, the width in the X-axis direction is approximately equal to the difference between the width of main body section 81 of fine movement stage WFS and the separation distance of stator sections 93a and 93b fixed to coarse movement stage WCS.

Encoder heads $17Xa_1$ and $17Xa_2$, and 17Ya are one-dimensional encoder heads whose measurement directions are in the X-axis direction and the Y-axis direction, respectively. Here, encoder heads $17Xa_1$ and $17Xa_2$ will be referred to as X heads, and encoder head 17Ya will be referred to as a Y head. In the embodiment, as X heads $17Xa_1$ and $17Xa_2$, and Y head 17Ya, heads with a configuration similar to heads 77x, 77ya, and 77yb previously described shown in FIG. 11A are employed.

As shown in FIG. 12, X heads $17Xa_1$ and $17Xa_2$, and Y head 17Ya are placed embedded in stator section 93a fixed to coarse movement stage WCS, with the outgoing section of the measurement beam facing the +Z side. Now, in a state where fine movement stage WFS is supported by coarse movement stage WCS substantially in its center, Y head 17Ya faces the center of grating 17Ga. To be more precise, an irradiation point of the measurement beam of Y head 17Ya coincides with the center of grating 17Ga. X heads $17Xa_1$ and $17Xa_2$ are separated at an equal distance on the ±Y side, respectively, from Y head 17Ya. More specifically, on grating 17Ga, the irradiation points of the measurement beams of X heads $17Xa_1$ and $17Xa_2$ are set apart at an equal distance on the ±Y sides, with the irradiation point of the measurement beam of Y head 17Ya as the center.

Figure 13A:
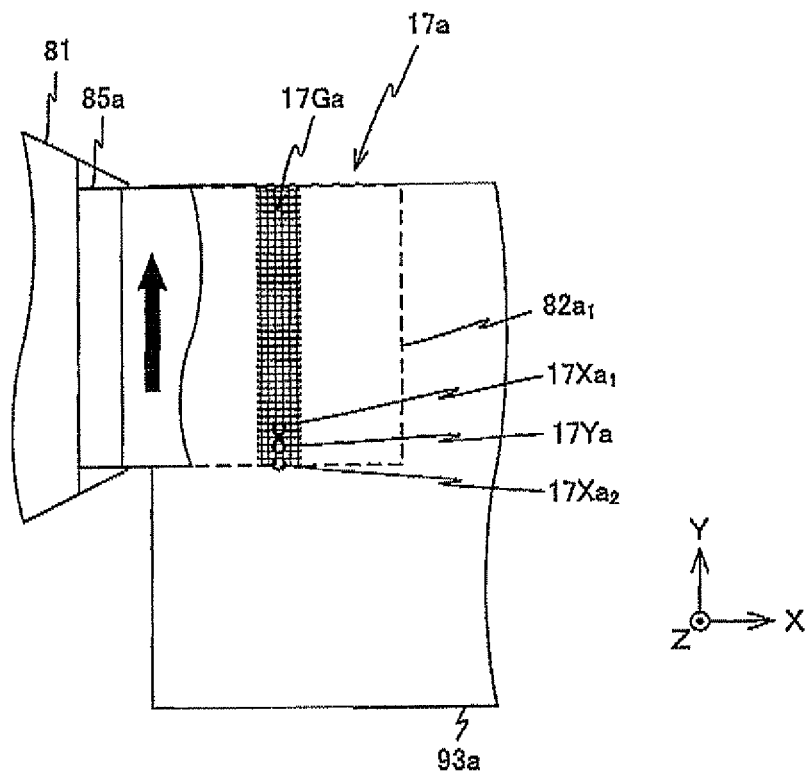
FIGS. 13A and 13B are planar views (Nos. 2 and 3) showing a placement of an encoder head and a scale configuring a relative stage position measurement system.
Figure 13B:
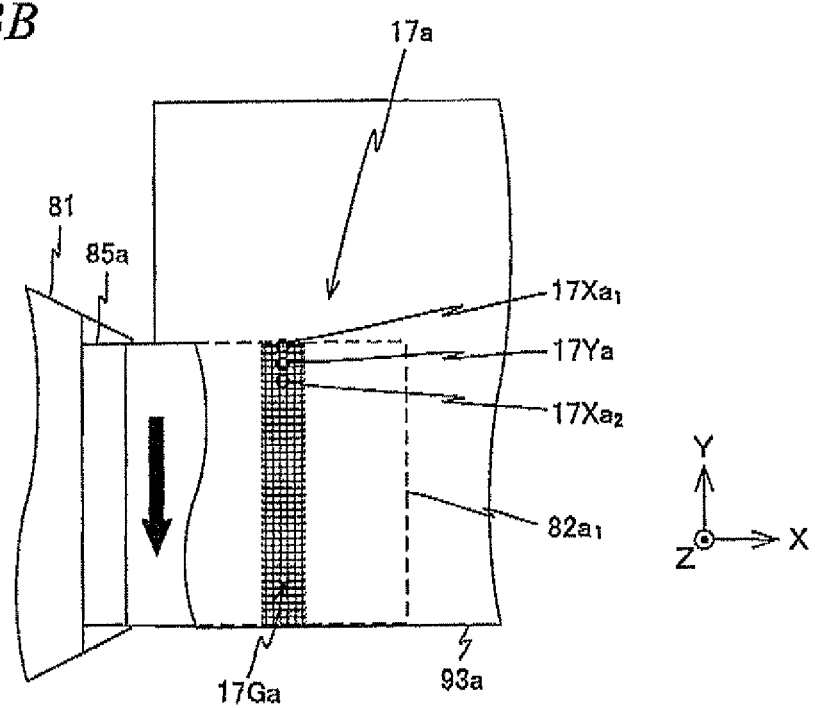

The separation distance of X heads $17Xa_1$ and $17Xa_2$ in the Y-axis direction, as an example, is substantially equal to (slightly shorter than) the difference between twice the length of grating 17Ga and a movement stroke of fine movement stage WFS with respect to coarse movement stage WCS. Therefore, as shown in FIG. 13A, in the case fine movement stage WFS is driven in the +Y direction with respect to coarse movement stage WCS and reaches the +Y end of the movement stroke, X heads $17Xa_1$ and $17Xa_2$ and Y head 17Ya face the vicinity of the −Y end of grating 17Ga. Further, as shown in FIG. 13B, in the case fine movement stage WFS is driven in the −Y direction with respect to coarse movement stage WCS and reaches the −Y end of the movement stroke, X heads $17Xa_1$ and $17Xa_2$ and Y head 171a face the vicinity of the +Y end of grating 17Ga. More specifically, in the total movement strokes of fine movement stage WFS, X heads $17Xa_1$ and $17Xa_2$, and Y head 17Ya always face grating 17Ga.

X heads $17Xa_1$ and $17Xa_2$ irradiate measurement beams on grating 17Ga facing the X heads, and by receiving the return lights (diffraction lights), measure the relative positional information of fine movement stage WFS in the X-axis direction with respect to coarse movement stage WCS. Similarly, Y head 17Ya measures the relative positional information of fine movement stage WFS in the Y-axis direction with respect to coarse movement stage WCS. These measurements results are supplied to main controller 20 (refer to FIG. 4).

Main controller 20 obtains the relative positional information in the XY plane between fine movement stage WFS and coarse movement stage WCS, using the measurement results which have been supplied. Here, as is previously described, the irradiation points (more specifically, measurement points) of the measurement beams of X heads $17Xa_1$ and $17Xa_2$ on grating 17Ga are distanced apart in the ±Y-direction, with the irradiation point (more specifically, the measurement point) of Y head 17Ya as the center. Accordingly, the relative positional information of fine movement stage WFS in the X-axis direction and the θz direction, with the measurement point of Y head 17Ya serving as a reference point, is obtained from the measurement results of X heads $17Xa_1$ and $17Xa_2$. Further, the relative positional information of fine movement stage WFS in the Y-axis direction is obtained from the measurement results of Y head 17Ya.

The second encoder system 17b is configured of two X heads and one Y head and a two-dimensional grating, similar to the first encoder system 17a. The two X heads and one Y head are placed on stator section 93b fixed to coarse movement stage WCS, and the two-dimensional grating is placed on the −Z surface (of plate-like member $82a_1$) of mover section 82b fixed to the −X end of fine movement stage WFS (main body section 81). These placements are symmetric to X heads $17Xa_1$ and $17Xa_2$, and Y head 17Ya and grating 17Ga configuring the first encoder system 17a, with respect to the Y-axis.

The measurement results of the two X heads and one Y head configuring the second encoder system 17b is also supplied to main controller 20 (refer to FIG. 4). Main controller 20 obtains the relative positional information in the XY plane between fine movement stage WFS and coarse movement stage WCS, using the measurement results which have been supplied. Main controller 20 then finally decides the relative positional information of fine movement stage WFS with respect to coarse movement stage WCS, for example, by averaging, based on the two relative positional information obtained from the measurement results of the first and the second encoder systems 17a and 17b. Incidentally, as relative positional information between fine movement stage WFS and coarse movement stage WCS, instead of, or in addition to the relative positional information within the XY plane, relative positional information can be measured in at least one direction of the Z-axis direction, the θx direction and the θy direction.

Main controller 20 obtains positional information (including the positional information in the θz direction) of coarse movement stage WCS in the XY plane, from the positional information of fine movement stage WFS measured using fine movement stage position measurement system 70 and the relative positional information between fine movement stage WFS and coarse movement stage WCS which is measured using relative stage position measurement system 17. And, based on the results, main controller 20 controls the position of coarse movement stage WCS. Especially at the time of exposure operation by the step-and-scan method to wafer W, main controller 20 steps and drives coarse movement stage WCS in a non-scanning direction.

In exposure apparatus 100 of the embodiment which it is configured in the manner described above, on manufacturing a device, first of all, main controller 20 detects the second fiducial marks on measurement plate 86 of fine movement stage WFS, using wafer alignment system ALG. Subsequently, main controller 20 performs wafer alignment (Enhanced Global Alignment (EGA) and the like which is disclosed in, for example, U.S. Pat. No. 4,780,617 and the like) and the like using wafer alignment system ALG. Incidentally, in exposure apparatus 100 of the embodiment, because wafer alignment system ALG is placed away in the Y-axis direction from projection unit PU, position measurement of fine movement stage WFS by the encoder system (measurement arm) of fine movement stage position measurement system 70 cannot be performed when performing the wafer alignment. Therefore, in exposure apparatus 100, wafer alignment is to be performed, while measuring the position of wafer W (fine movement stage WFS) via a laser interferometer system (not shown). However, besides this, a second fine movement stage position measurement system (omitted in drawings) including a measurement arm having a configuration similar to measurement arm 71 of fine movement stage position measurement system 70 can be arranged in the vicinity of wafer alignment system ALG, and position measurement of the fine movement stage within the XY plane can be performed using this at the time of the wafer alignment. Further, because wafer alignment system ALG and projection unit PU are distanced, main controller 20 converts array coordinates of each shot area on wafer W acquired from the wafer alignment into array coordinates which are based on the second fiducial marks.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS and the like. Then, main controller 20 performs exposure operation by the step-and-scan method, based on results of the reticle alignment and the results of the wafer alignment (array coordinates which uses the second fiducial marks of each of the shot areas on wafer W as a reference), and transfers the pattern of reticle R on each of the plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. In this case, scanning exposure by the liquid immersion exposure is performed. In exposure apparatus 100 of the embodiment, during the series of exposure operations described above, main controller 20 measures the position of fine movement stage WFS (wafer W) using fine movement stage position measurement system 70, and the position of wafer W is controlled based on the measurement results.

Figure 14A:
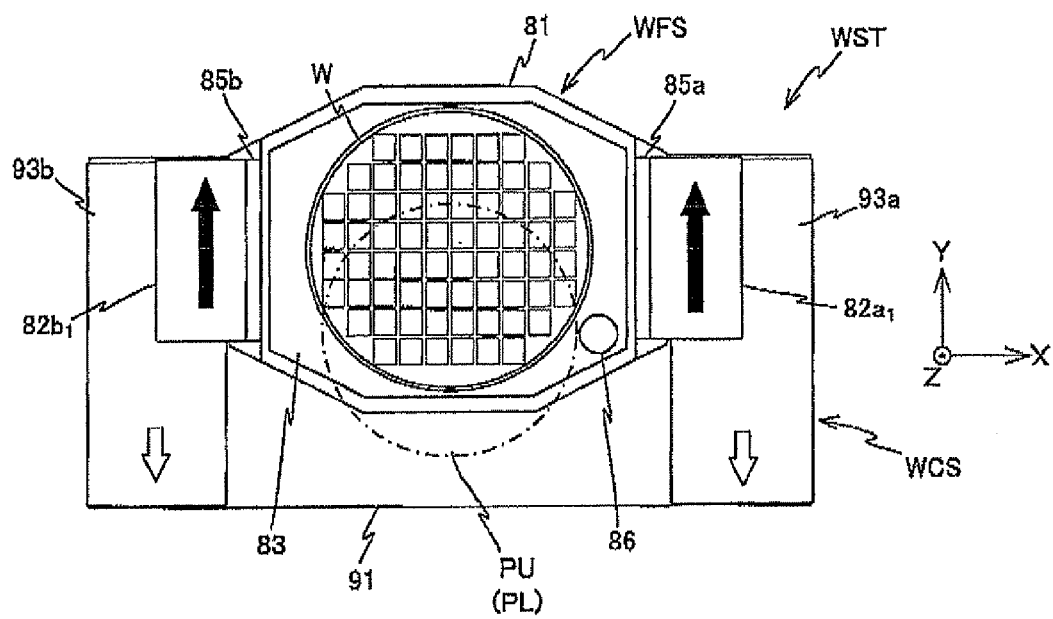
FIG. 14A is a view used to explain a drive method of a wafer at the time of scanning exposure.

Incidentally, while wafer W has to be scanned with high acceleration in the Y-axis direction at the time of scanning exposure operation described above, in exposure apparatus 100 of the embodiment, main controller 20 scans wafer W in the Y-axis direction by driving (refer to the black arrows in FIG. 14A) only fine movement stage WFS in the Y-axis direction (and in directions of the other five degrees of freedom, if necessary), without driving coarse movement stage WCS in principle at the time of scanning exposure operation as shown in FIG. 14A. This is because when moving only fine movement stage WFS, weight of the drive object is lighter when comparing with the case where coarse movement stage WCS is driven, which allows an advantage of being able to drive wafer W with high acceleration. Further, because position measuring accuracy of fine movement stage position measurement system 70 is higher than wafer stage position measurement system 16 as previously described, it is advantageous to drive fine movement stage WFS at the time of scanning exposure. Incidentally, at the time of this scanning exposure, coarse movement stage WCS is driven to the opposite side of fine movement stage WFS by an operation of a reaction force (refer to the outlined arrows in FIG. 14A) by the drive of fine movement stage WFS. More specifically, because coarse movement stage WCS functions as a countermass, momentum of the system consisting of the entire wafer stage WST is conserved and centroid shift does not occur, therefore, inconveniences such as unbalanced load acting on base board 12 by the scanning drive of fine movement stage WFS do not occur.

Figure 14B:
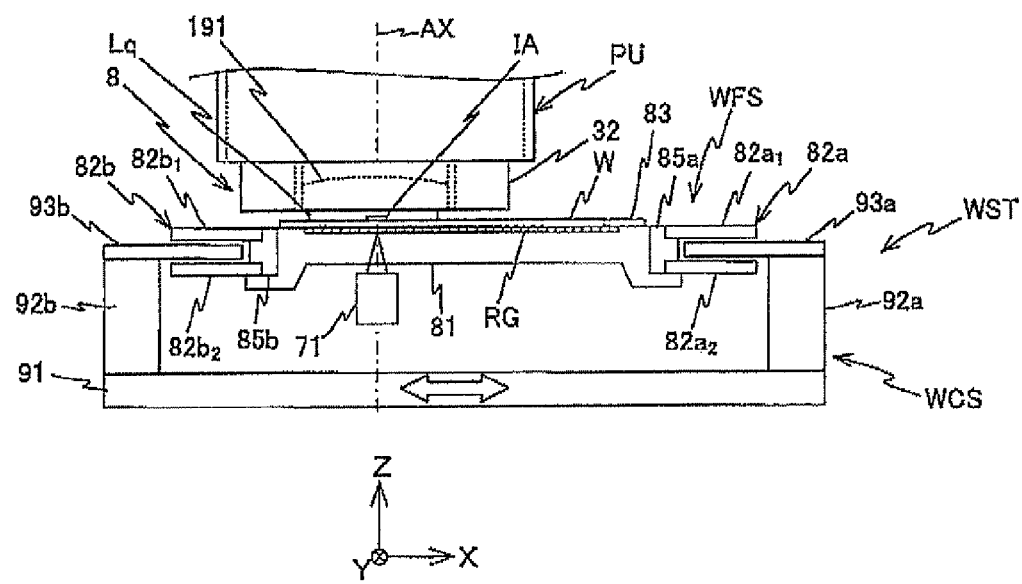
FIG. 14B is a view used to explain a driving method of a wafer at the time of stepping.

Meanwhile, when the movement (stepping) operation between shots in the X-axis direction is performed, because movement capacity in the X-axis direction of fine movement stage WFS is small, main controller 20 moves wafer W in the X-axis direction by driving coarse movement stage WCS in the X-axis direction as shown in FIG. 14B. Now, because the positional information of coarse movement stage WCS is measured using fine movement stage position measurement system 70 and relative stage position measurement system 17, coarse movement stage WCS can be driven and controlled with approximately the same level of precision as the precision of the drive control of fine movement stage WFS.

Figure 15A:
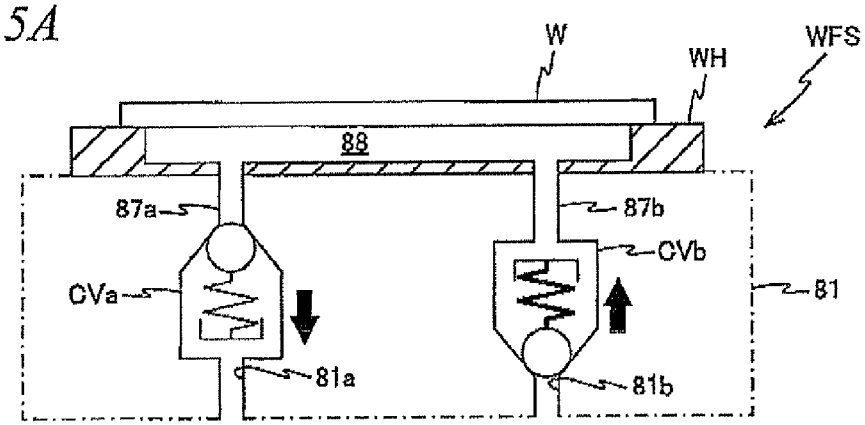
FIGS. 15A to 15C are views schematically showing a configuration of a fine movement stage and a wafer holder.

Next, suction holding of the wafer by the wafer holder and release of the suction will be described. FIG. 15A schematically shows a configuration of fine movement stage WFS.

As shown in FIG. 15A, a suction opening section 81a is formed in main body section 81 of fine movement stage WFS. The position of suction opening section 81a is not restricted in particular, and can be formed, for example, on the side surface, the lower surface and the like of main body section 81. Further, inside main body section 81, an opening formed at the bottom section of wafer holder WH, and a piping member 87a, which makes an outer space communicate with a decompression chamber 88 formed in between wafer holder WH and the back surface of wafer W via suction opening section 81a, are provided. Along the pipe line of piping member 87a, a check valve CVa is placed. Check valve CVa maintains a decompressed state of decompression chamber 88, by restricting a direction in which the gas flows within piping member 87a to one direction (refer to the black arrows in FIG. 15A), from decompression chamber 88 to the outer space, or more specifically, by keeping gas with higher pressure than the gas within decompression chamber 88 from flowing inside decompression chamber 88 from the outer space.

Figure 15B:
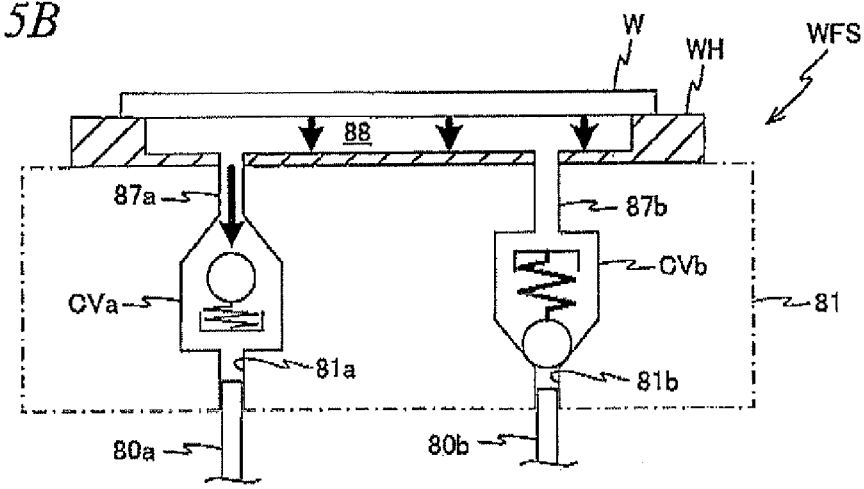
Figure 15C:
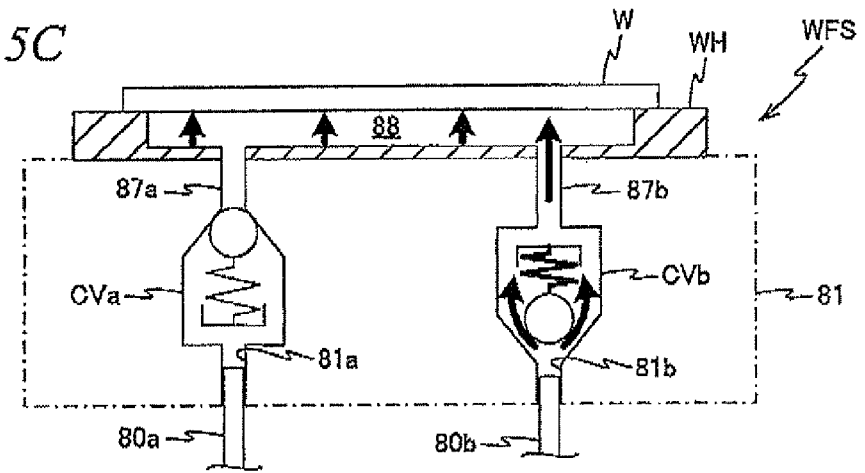

Further, exposure apparatus 100 has a suction piping 80a, which is positioned so that when wafer stage WST was positioned at a predetermined wafer exchange position, one end of suction piping 80a would be inserted into piping member 87a via suction opening section 81a, as shown in FIGS. 15B and 15C. The other end of suction piping 80a is connected to a vacuum pump (not shown). When wafer W is mounted on wafer holder WH by a wafer carrier apparatus (not shown), main controller 20 (refer to FIG. 4) controls the vacuum pump and absorbs the gas within decompression chamber 88. Suction piping 80a and piping member 87a are tightly sealed together by an O-ring (not shown) and the like. This makes the pressure in decompression chamber 88 lower than the pressure of the outer space, and wafer W is held by suction by wafer holder WH. Further, when the pressure inside decompression chamber 88 reaches a predetermined pressure, main controller 20 stops the suction of gas of decompression chamber 88 by the vacuum pump. After this, even if wafer stage WST moves from the wafer exchange position and suction piping 80a is pulled out from piping member 87a, because the pipe line of piping member 87a is blocked along the line by check valve CVa, the decompressed state of decompression chamber 88 is maintained, and the state where wafer W is held by suction by wafer holder WH is maintained. Accordingly, it is not necessary, for example, to connect a piping member (e.g., a tube) to fine movement stage WFS in order to suction the gas within decompression chamber 88.

Further, because unloading wafer W becomes difficult when the decompressed state of decompression chamber 88 is constantly maintained, a piping member 87b is provided in main body section 81 as shown in FIG. 15A so that the decompressed state of decompression chamber 88 can be released. Piping member 87b, similar to piping member 87a, has decompression chamber 88 communicate with the outer space, via the opening formed at the bottom section of wafer holder WH and a release opening section 81b formed in main body section 81. The position of release opening section 81b is not restricted in particular, and can be formed, for example, on the side surface, the lower surface and the like of main body section 81. Along the pipe line of piping member 87b, a check valve CVb is placed. Check valve CVb restricts a direction in which the gas flows within piping member 87b to one direction (refer to the black arrows in FIG. 15A), from the outer space to decompression chamber 88. Incidentally, in a spring which energizes a valve member (in FIGS. 15A to 15C, e.g., a ball) of check valve CVb to a closed position, a spring constant is set so that the valve member does not move (so that the check valve is not opened in a state shown in FIG. 15B) to an open position in a state (a state shown in FIG. 15A) where decompression chamber 88 is a decompressed space.

Further, exposure apparatus 100 has a gas supply piping 80b, which is positioned so that when wafer stage WST was positioned at a predetermined wafer exchange position, one end of gas supply piping 80b would be inserted into piping member 87b from release opening section 81b, as shown in FIGS. 15B and 15C. The other end of gas supply piping 80b is connected to a gas supply device (not shown). On unloading wafer W, main controller 20 (refer to FIG. 4) controls the gas supply device so that a high pressure gas is blown into piping member 87b. This turns check valve CVb into an open state, which introduces the high pressure gas into decompression chamber 88, which in turn releases the suction of wafer W by wafer holder WH. Further, because the gas introduced into decompression chamber 88 from the gas supply device blows out from below wafer W toward the rear surface of wafer W, the weight of wafer W itself is canceled out. More specifically, the gas supply device assists an operation of a wafer carrier apparatus to lift wafer W from wafer holder WH. Accordingly, it becomes possible to reduce the size of the wafer carrier apparatus.

Now, in actual practice, on the rear side of wafer holder WH at positions outside the forming range of the grating, the opening section previously described is formed which communicates with piping members 87a and 87b. Or, the opening section can be formed on the side surface of wafer holder WH, and piping members 87a and 87b can be connected.

Incidentally, in the case of using a wafer holder that holds the wafer by electrostatic chucking as the wafer holder, a rechargeable battery can be installed in the fine movement stage, and the battery can be recharged along with the wafer exchange at the predetermined wafer exchange position. In this case, a receiving terminal can be provided in the fine movement stage, and in the vicinity of the wafer exchange position, a feeding terminal can be placed, which is positioned so that the terminal electrically connects to the receiving terminal described above when the wafer stage is positioned at the wafer exchange position.

As described above, according to exposure apparatus 100 of the embodiment, the positional information of fine movement stage WFS in the XY plane is measured by main controller 20, using encoder system 73 of fine movement stage position measurement system 70 having measurement arm 71 which faces grating RG placed on fine movement stage WFS. In this case, because a space is formed inside coarse movement stage WS and each of the heads of fine movement stage position measurement system 70 are placed in this space, only space exists between fine movement stage WFS and the heads. Accordingly, each of the heads can be placed close to fine movement stage WFS (grating RG), which allows measurement of the positional information of fine movement stage WFS by fine movement stage position measurement system 70 with high precision, which in its turn allows a highly precise drive of fine movement stage WFS via coarse movement stage drive system 51 and/or fine movement stage drive system 52 by main controller 20. Further, in this case, the irradiation point of the measurement beams of each of the heads of encoder system 73 and laser interferometer system 75 configuring fine movement stage position measurement system 70 emitted from measurement arm 71 on grating RG coincides with the center (exposure position) of irradiation area (exposure area) IA of exposure light IL irradiated on wafer W. Accordingly, main controller 20 can measure the positional information of fine movement stage WFS with high accuracy, without being affected by the so-called Abbe error. Further, because optical path lengths in the atmosphere of the measurement beams of each of the heads of encoder system 73 can be made extremely short by placing measurement arm 71 right under grating RG, the influence of air fluctuation is reduced, and also in this point, the positional information of fine movement stage WFS can be measured with high accuracy.

Further, according to exposure apparatus 100 of the embodiment, fine movement stage WFS is supported in a non-contact manner by fine movement stage drive system 52 configuring a part of wafer stage drive system 53, or to be more precise, the first and second drive sections each configuring a part of fine movement stage drive system 52, so that the fine movement stage can be relatively moved with respect to coarse movement stage WCS within a plane parallel to the XY plane. And, by the first and second drive sections, a drive force can be applied to one end and the other end of fine movement stage WFS in the X-axis direction, in each of the Y-axis direction, the X-axis direction, the Z-axis direction, the θy direction, and the θx direction. Magnitude and generation direction of the drive force in each of the directions are controlled independently by main controller 20, by controlling the magnitude and/or the direction of the current supplied to each of the coils in coil units $CU_1$, and $CU_2$ previously described. Accordingly, not only can fine movement stage WFS be driven in directions of six degrees of freedom, in the Y-axis direction, the X-axis direction, the Z-axis direction, the θz, the θy, and the θx directions by the first and second drive sections, by making the first and the second drive sections apply drive forces simultaneously in directions opposite to each other in the θy direction to one end and the other end of fine movement stage WFS in the X-axis direction, fine movement stage WFS (and wafer W held by the stage) can be deformed to a concave shape or a convex shape within a plane (an XZ plane) perpendicular to the Y-axis. In other words, in the case when fine movement stage WFS (and wafer W which is held by the stage) is deformed by its own weight and the like, this deformation can be suppressed.

Further, according to exposure apparatus 100 of the embodiment, because fine movement stage WFS can be driven with good precision, it becomes possible to drive wafer W mounted on this fine movement stage WFS in synchronization with reticle stage RST (reticle R) with good precision, and to transfer a pattern of reticle R onto wafer W with good precision by scanning exposure. Further, because deflection of fine movement stage WFS and wafer W can also be corrected, an area including the irradiation area (exposure area IA) of illumination light IL on the wafer W surface can be maintained to be within the range of the depth of focus of projection optical system PL during scanning exposure, which makes exposure with high precision without exposure defects due to focus possible.

Incidentally, the method of making fine movement stage WFS (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA.

A First Modified Example

Figure 16:
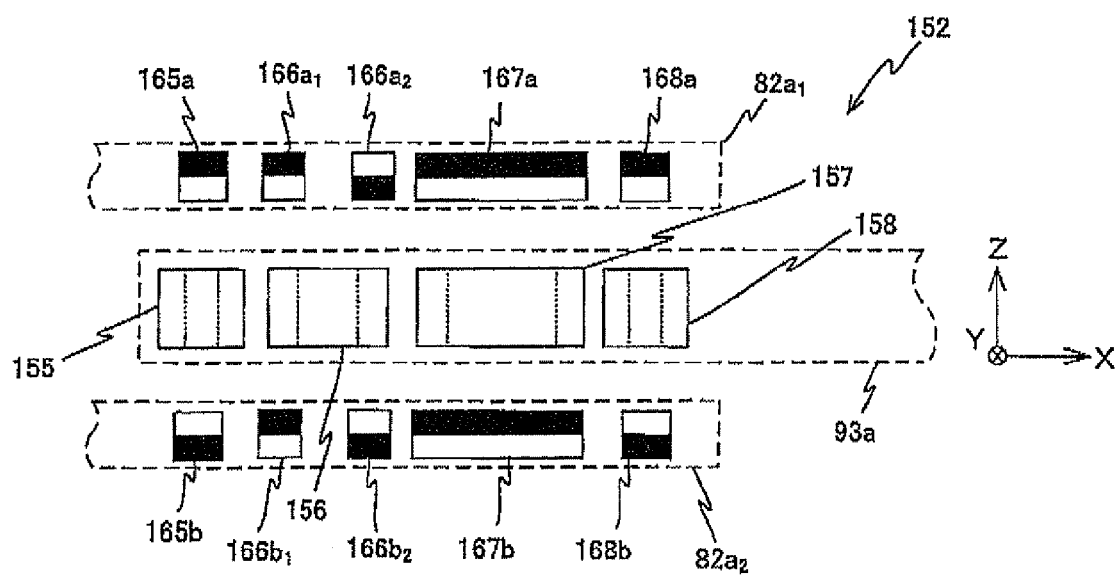
FIG. 16 is a view showing a fine movement stage drive system related to a first modified example.

Incidentally, the configuration of fine movement stage drive system 52 (the first and second drive sections) driving fine movement stage WFS with respect to coarse movement stage WCS is not limited to the one described in the embodiment above. FIG. 16 shows another example of the fine movement stage drive system. In fine movement stage drive system 52 in the embodiment described above, while fine movement stage WFS was driven in Y-axis direction and the Z-axis direction using YZ coils 55 and 57 that were in common, in a fine movement stage drive system 152 shown in FIG. 13, Z drive coils 155 and 158 used exclusively to drive fine movement stage WFS in the Z-axis direction, and a Y drive coil 157 used exclusively to drive fine movement stage WFS in the I-axis direction are provided. In fine movement stage drive system 152, a plurality of first Z drive coils 155 is placed along the Y-axis direction in the vicinity of an end on the −X side inside stator section 93a, and on the +X side of these coils, X drive coil 156 whose longitudinal direction is in the Y-axis direction and drives fine movement stage WFS in the X-axis direction is placed. Further, on the +X side of X drive coil 156, a plurality of Y drive coils 157 is placed along the Y-axis direction, and furthermore, on the +X side of these coils, a plurality of second Z drive coils 158 is placed along the Y-axis direction. In plate-like members $82a_1$ and $82a_2$ of fine movement stage WFS, permanent magnet 165a to 168a, and 165b to 168b are placed facing these coils 155 to 158 (for the placement of each of the permanent magnets, refer to FIGS. 5, 6A, and 6B). In fine movement stage drive system 152 shown in FIG. 13, control is easy because Z drive coils 155 and 158, and Y drive coil 157 can be controlled independently. Further, because fine movement stage WFS can be supported by levitation with a constant levitation force regardless of fine movement stage WFS in the Y-axis direction, the position of wafer W in the Z-axis direction becomes stable.

A Second Modified Example

Further, in the embodiment previously described, a configuration can be employed in which fine movement stage WFS and coarse movement stage WCS are relatively movable in the X-axis direction, for example, by the same or a larger distance than the size of a shot area in the X-axis direction on wafer W. In this case, while the configuration of fine movement stage drive system 52 which drives fine movement stage WFS with respect to coarse movement stage WCS is basically the same, a configuration having longer drive strokes in the X-axis direction should be employed. For example, as the pair (two) of permanent magnets $66a_1$ and $66a_2$ configuring a part of magnet unit $MUa_1$ and permanent magnets $66b_1$ and $66b_2$ configuring a part of magnet unit $MUa_2$, a magnet whose length (width) in the X-axis direction is a length corresponding to a desired drive stroke can be employed, and as X coil 56 configuring a part of coil unit CUa, a coil whose size corresponds to these permanent magnets $66a_1$, $66a_2$, $66b_1$, and $66b_2$ can be employed. A similar configuration can be employed for magnet units $MUb_1$ and $MUb_2$, and coil unit CUb. Besides this, as for the X-axis direction as well, a linear motor configuration consisting of a combination of magnet rows and coil rows can be employed as in the Y-axis direction.

In any case, in the case of employing a configuration where fine movement stage WFS and coarse movement stage WCS are relatively movable by a predetermined distance or more not only in the Y-axis direction but also in the X-axis direction, coarse movement stage WCS functions as a counter mass also at the time of drive in the X-axis direction as in the case when fine movement stage WFS is driven in the Y-axis direction by fine movement stage drive system 52. In this case, not only the scanning exposure operation but also a movement (stepping) operation between shots can be performed by driving fine movement stage WFS (wafer W), and in both of the operations, the momentum of the system consisting of the entire wafer stage WST is conserved.

Further, in this case, as is disclosed in, for example, U.S. Patent Application Publication No. 2008/0143994, main controller 20 can provide an impulse Ft1 expressed as in the following formula (1) to coarse movement stage WCS, so as to provide an initial velocity $v_0$ to coarse movement stage WCS in the stepping direction (the +X direction, as an example) of fine movement stage WFS (wafer W) in the case of exposing shot areas on a first row to which a first shot area belongs, at an acceleration starting position of a first shot area on wafer W.

$$Ft1 = (M+m) \cdot SD/T \qquad (1)$$

In this case, M is the mass of coarse movement stage WCS and m is the mass of fine movement stage WFS including wafer W and the like, that is, (M+m) is the mass of the system consisting of the entire wafer stage WST, SD is a distance (more specifically, the stepping distance at the time of step movement operation) between the center of adjacent shot areas in the stepping direction (the X-axis direction), and T is the time from the point of time when scanning of fine movement stage WFS to expose a shot area has been completed to the point of time when scanning of fine movement stage WFS to expose the next shot area adjacent in the X-axis direction has been completed.

By the action of impulse Ft1, initial velocity $v_0$ expressed as in the following formula (2) is provided to coarse movement stage WCS.

$$v_0 = (M+m) \cdot SD/T/M \qquad (2)$$

In this example, because it may be considered that the momentum of the system consisting of the entire wafer stage WST including fine movement stage WFS and coarse movement stage WCS is substantially conserved, hereinafter, coarse movement stage WCS will have a momentum which is larger by only $v_0 \cdot M = Ft1$ when compared to a momentum caused by an external force.

Then, while exposure of the shot areas in the first row to which the first shot area belongs is performed by alternate scanning, the centroid of the system consisting of the entire wafer stage WST performs a constant velocity movement in the +X direction, as disclosed in detail in, for example, U.S. Patent Application Publication No. 2008/0143994. More specifically, in this example, initial velocity $v_0$ is an initial velocity that makes the centroid of the system perform a constant velocity movement, and is defined to the value previously described, based on a mass M of coarse movement stage WCS and a mass m of fine movement stage WFS including wafer W and the like, and impulse Ft1 previously described is set in order to provide this initial velocity $v_0$ to coarse movement stage WCS.

Further, when exposure of the shot areas belonging to the first row is completed, main controller 20 provides an impulse to coarse movement stage WCS so as to provide initial velocity $v_0$ of the same magnitude but in a direction opposite (the –X direction) to the description above. Then, by a complete alternate scan, the centroid of the system consisting of the entire wafer stage WST performs a constant velocity movement in the –X direction, while exposure of shot areas in a second row is performed by alternate scanning.

Hereinafter, each time shot areas belonging to a third row, a fourth row, and so forth are exposed, main controller 20 provides an impulse to coarse movement stage WCS so as to provide initial velocity $v_0$ of the same magnitude in a direction opposite to the previous row, so that the centroid of the system consisting of the entire wafer stage WST performs a constant velocity movement in the +X direction and in the –X direction.

As described in detail above, in this example, because main controller 20 provides initial velocity fine $v_0$ in the +X direction (or the –X-direction) to coarse movement stage WCS when movement stage WFS moves, for example, in the +X direction (or the –X-direction), in the case fine movement stage WFS moves in the +X direction (or the –X direction) driven by fine movement stage drive system 52, coarse movement stage WCS moves in the –X direction (or the +X direction) in accordance with the law of conservation of momentum receiving the reaction force of the driving force, however, because movement in the +X direction (or the –X direction) occurring due to the initial velocity is also performed simultaneously at this point, as a consequence, coarse movement stage WCS moves in the –X direction (or the +X direction) only by a distance, which is a deduction of a movement distance in the +X direction due to the initial velocity from a movement distance of coarse movement stage WCS upon free movement in accordance with the law of conservation of momentum by an operation of a reaction force of the drive force in the +X direction (or the –X direction) of fine movement stage WFS, which shortens the movement distance.

Further, in this example, because fine movement stage WFS moves, for example, in the +X direction (or the –X direction) with acceleration or deceleration upon stepping operations, coarse movement stage WCS is accelerated in the +X direction (or the –X direction) while fine movement stage WFS is decelerated, which can further reduce the movement distance in the –X direction (or the +X direction) of coarse movement stage WCS that has received the reaction force of the drive force of fine movement stage WFS in the +X direction (or the –X direction).

Therefore, according to this example, the strokes which are necessary to move coarse movement stage WCS can be shortened. Especially, because fine movement stage WFS performs an operation including the step movement to the +X direction (or the –X direction), or more particularly, fine movement stage WFS alternately repeats acceleration and deceleration in the +X direction (or the –X direction), the strokes in the X-axis direction necessary to move coarse movement stage WCS can be shortened the most.

Furthermore, in this example, main controller 20 provides the initial velocity to coarse movement stage WCS so that the centroid of the system including fine movement stage WFS and coarse movement stage WCS performs a constant velocity movement in the X-axis direction. As a consequence, while exposure operation of a plurality of shot areas in the same row on wafer W is performed, coarse movement stage WCS performs a reciprocal motion within a constant range (e.g., ±Δx) with the position of fine movement stage WFS serving as a reference, with respect to fine movement stage WFS which gradually moves in the +X direction (or the –X direction) while alternately repeating stepping and stopping operations. Accordingly, as the strokes of coarse movement stage WCS, a distance prepared that has some margin added to 2Δx will be enough. From a different point of view, when considering coarse movement stage WCS as a reference, if coarse movement stage WCS is to be driven in the X-axis direction as is previously described in the case of stepping, an initial velocity which makes the centroid of the system including fine movement stage WFS and coarse movement stage WCS perform a constant velocity movement in the X-axis direction can be provided to fine movement stage WFS. In this case, as the strokes of fine movement stage WFS, a distance prepared that has some margin added to 2Δx will be enough.

Further, when the initial velocity is provided to coarse movement stage WCS (or fine movement stage WFS), coarse movement stage WCS can be shifted in the direction of the initial velocity by Δx with respect to the fine movement stage. Further, also when driving fine movement stage WFS in the Y-axis direction, main controller 20 can provide the initial velocity to coarse movement stage WCS in the same direction as the drive direction as in the description above.

Incidentally, in the embodiment above, while alignment of the wafer was performed measuring the position of wafer W (fine movement stage WFS) via the laser interferometer system (not shown), besides this, a second fine movement stage position measurement system including a measurement arm having a configuration similar to measurement arm 71 of fine movement stage position measurement system 70 can be arranged in the vicinity of wafer alignment system ALG, and position measurement of the fine movement stage within the XY plane can be performed using this at the time of the wafer alignment.

A Third Modified Example

Figure 17:
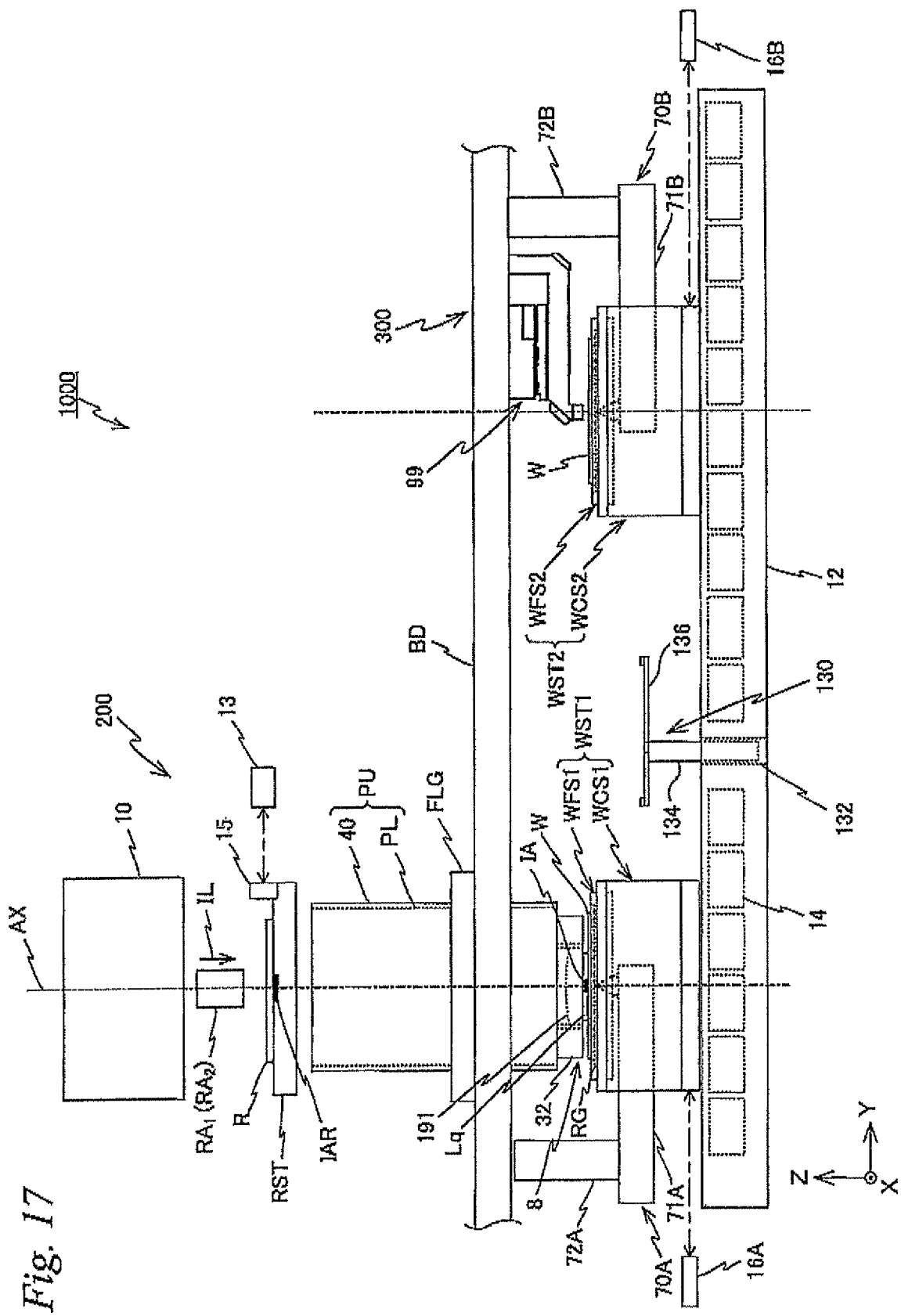
FIG. 17 is a view showing an exposure apparatus related to a third modified example.

FIG. 17 shows a configuration of an exposure apparatus 1000 related to a third modified example which is equipped with such a second fine movement stage position measurement system. Exposure apparatus 1000 is a twin wafer stage type exposure apparatus which is equipped with an exposure station (an exposure processing section) 200 where projection unit PU is placed, and a measurement station (a measurement processing section) 300 where alignment system ALG is placed. Here, the same or similar signs will be used for sections the same or similar to exposure apparatus 100 of the first embodiment previously described, and a detailed description thereabout will be omitted or simplified. Further, when there is an equivalent member in both exposure station 200 and measurement station 300, the reference code of each of the members will have a suffix of A and B for identification. However, the reference code of the two wafer stages will be expressed as WST1 and WST2.

Exposure station 200, as it can be seen when comparing FIGS. 1 and 17, is configured basically the same as exposure apparatus 100 of the first embodiment previously described. Further, in measurement station 300, in a placement symmetric to a fine movement stage position measurement system 70A on the exposure station 200 side, a fine movement stage position measurement system 70B is placed. Further, in measurement station 300, instead of alignment system ALG, an alignment device 99 is attached to main frame RD in a state suspended from the main frame. As alignment device 99, a five-lens alignment system is used equipped with five FIA systems, whose details are disclosed in, for example, PCT International Publication No. 2008/056735.

Further, in exposure apparatus 1000, at a position between exposure station 200 and measurement station 300 of base board 12, a center table 130 which is vertically movable is installed. Center table 130 is equipped with a shaft 134 which can be vertically moved by a drive device 132 (refer to FIG. 18), and a table main section 136, which has a Y shape in a planar view, fixed to the upper end of shaft 134. Further, coarse movement stages WCS1 and WCS2 which configure wafer stages WST1 and WST2, respectively, are each configured separable into two sections, which are a first section and a second section, with a separation line in the center in the longitudinal direction of coarse movement slider section 91 serving as a boundary. Further, at the bottom surface of each of the coarse movement stages WCS1 and WCS2, a notch, which is wider than shaft 134 and has an overall U shape including the separation line of the first section and the second section, is formed. This allows both wafer stages WST1 and WST2 to carry fine movement stage WFS1 or WFS2 above table main section 136.

Figure 18:
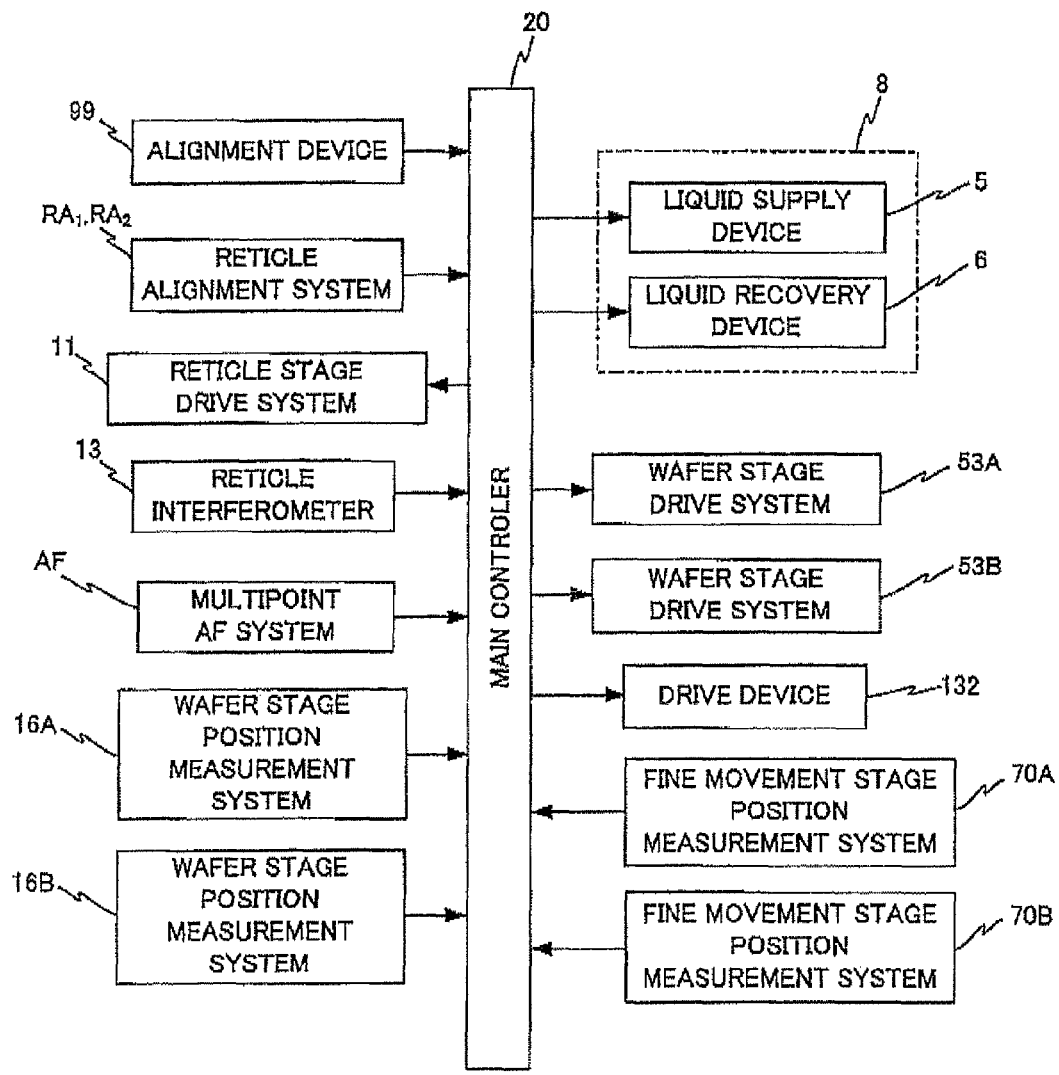
FIG. 18 is a block diagram showing a main configuration of a control system of the exposure apparatus in FIG. 17.

FIG. 18 shows a main configuration of the control system of exposure apparatus 1000 in a block diagram.

In exposure apparatus 1000 configured in the manner described above, while exposure to wafer W is performed concurrently on fine movement stage WFS1 supported by coarse movement stage WCS1 configuring wafer stage WST1 in exposure station 200, wafer alignment (such as, for example, EGA) and the like is performed to wafer W on fine movement stage WFS2 supported by coarse movement stage WCS2 configuring wafer stage WST2 in measurement station 300.

Then, when exposure has been completed, wafer stage WST1 carries fine movement stage WFS1 holding wafer W which has been exposed to the area above table main section 136. And then, center table 130 is driven upward by drive device 132, and main controller 20 controls a coarse movement stage drive system of a wafer stage drive system 53A so that coarse movement stage WCS1 is separated into the first section and the second section. Then, after center table 130 is driven downward by drive device 132, coarse movement stage WCS1 returns to the state before separation (is integrated). And, wafer stage WST2 approaches or comes into contact with coarse movement stage WCS1 that has been integrated from the −Y-direction, and fine movement stage WFS2 holding wafer W which has undergone alignment is moved from coarse movement stage WCS2 and mounted on coarse movement stage WCS1. This series of operations is performed by main controller 20 controlling a coarse movement stage drive system and a fine movement stage drive system of wafer stage drive system 53B.

Then, coarse movement stage WCS1 which holds fine movement stage WFS2 moves to exposure station 200, and then, exposure operation by the step-and-scan method is performed based on reticle alignment, results of the reticle alignment, and results of wafer alignment (array coordinates which are based on second fiducial marks of each shot area on wafer W).

In parallel with this exposure, coarse movement stage WCS2 withdraws in the −Y direction, and fine movement stage WFS1 held on table main section 136 is carried to a predetermined position by a carrier system (not shown) where wafer W that has undergone exposure held by fine movement stage WFS1 is changed to a new wafer W by a wafer exchange mechanism (not shown). Here, at the wafer exchange position, a decompression chamber (decompressed space) formed by a wafer holder (omitted in drawings) of fine movement stage WFS2 and the back surface of wafer W is connected to a vacuum pump via an exhaust pipe line (not shown) and piping, and by main controller 20 making the vacuum pump operate, gas inside the decompression chamber is exhausted outside via the exhaust pipe line and the piping, which creates a negative pressure within the decompression chamber and starts the suction of wafer W by the wafer holder. And when the inside of the decompression chamber reaches a predetermined pressure (negative pressure), main controller 20 suspends the vacuum pump. When the vacuum pump is suspended, the exhaust pipe line is closed by an action of a check valve (not shown). Accordingly, the decompressed state of the decompression chamber is maintained, and wafer W is held by the wafer holder even if tubes and the like used to suction the gas in the decompression chamber by vacuum are not connected to fine movement stage WFS2. This allows fine movement stage WFS2 to be separated from the coarse movement stage and to be carried without any problems.

Then, fine movement stage WFS1 which holds a new wafer W is carried on table main section 136 by the carrier system, and is passed, furthermore, on to coarse movement stage WCS2 from above table main section 136. Hereinafter, a processing similar to the one described above is repeatedly performed.

Accordingly, in exposure apparatus 1000 related to this modified example, in exposure station 200, positional information of fine movement stages WFS1 and WFS2 in the XY plane when exposure of wafer W is performed is measured with high precision in a manner similar to the embodiment previously described by main controller 20, using an encoder system of fine movement stage position measurement system 70A which has a measurement arm 71A. Further, by main controller 20 controlling (fine movement stage drive system of) wafer stage drive system 53A, deflection correction of the wafer subject to exposure in exposure station 200 can be performed in a manner similar to the previous description.

In addition to this, in exposure apparatus 1000 related to this modified example, in measurement station 300, positional information of fine movement stages WFS1 and WFS2 in the XY plane when alignment of wafer W is performed is measured with high precision in a manner similar to the previous description by main controller 20, using an encoder system of fine movement stage position measurement system 70B which has a measurement arm 71B, and this makes wafer alignment with higher precision possible when compared with the case where wafer alignment is performed while measuring the position of wafer W (fine movement stage) via a laser interferometer system. Then, exposure of wafer W is performed by the step-and-scan method, based on results of the wafer alignment (information on array coordinates of each shot area on wafer W acquired, for example, from EGA, which are converted into coordinates that are based on the second fiducial marks) and results of reticle alignment and the like. Further, by main controller 20 controlling (fine movement stage drive system of) wafer stage drive system 53B on wafer alignment in measurement station 300, deflection correction of the fine movement stage previously described, or more particularly, deflection correction of the wafer can be performed. In such a case, position measurement of alignment marks can be performed with high precision. Therefore, according to exposure apparatus 1000 related to the modified example, exposure of a wafer with higher precision based on highly precise alignment results becomes possible. Further, in the modified example, a hollow section is formed inside fine movement stages WFS1 and WFS2 as in the embodiment previously described, which reduces their weight, which in turn improves the position controllability of the stages.

Incidentally, in the embodiment and the modified example described above, the case has been described where the fine movement stage is supported movable with respect to the coarse movement stage, and a sandwich structure which vertically sandwiches a coil unit between a pair of magnetic units is employed as the first and second drive sections that drive the fine movement stage in directions of six degree of freedom. However, as well as this, the first and second drive sections can employ a structure where a magnet unit is vertically sandwiched by a pair of coil units, or a sandwich structure does not have to be employed. Further, a coil unit can be placed in the fine movement stage, and a magnet unit can be placed in the coarse movement stage.

Further, in the embodiment and the modified example described above, while the fine movement stage was driven in directions of six degrees of freedom by the first and second drive sections, the fine movement stage does not necessarily have to be driven in directions of six degrees of freedom. For example, the first and second drive sections do not have to drive the fine movement stage in the θx direction.

Incidentally, in the embodiment above, while the case has been described where the entire fine movement stage position measurement system 70 is made of, for example, glass, and is equipped with measurement arm 71 in which light can proceed inside, the present invention is not limited to this. For example, at least only the part where each of the laser beams previously described proceed in the measurement arm has to be made of a solid member which can pass through light, and the other sections, for example, can be a member that does not transmit light, or can have a hollow structure. Further, as a measurement arm, for example, a light source or a photodetector can be built in the tip of the measurement arm, as long as a measurement beam can be irradiated from the section facing the grating. In this case, the measurement beam, of the encoder does not have to proceed inside the measurement arm.

Further, in the measurement arm, the part (beam optical path segment) where each laser beam proceeds can be hollow. Or, in the case of employing a grating interference type encoder system as the encoder system, the optical member on which the diffraction grating is formed only has to be provided on an arm that has low thermal expansion, such as for example, ceramics, Inver and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path).

Furthermore, the measurement arm need not have any particular shape. Further, fine movement stage position measurement system 70 does not always have to be equipped with a measurement arm, and will suffice as long as it has a head which is placed facing grating RG inside the space of coarse movement stage WCS that irradiates at least one measurement beam on grating RG and receives a diffraction light from grating RG, and can measure the positional information of fine movement stage WFS at least within the XY plane, based on the output of the head.

Further, in the embodiment above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. In the case two 2D heads are provided, detection points of the two heads can be arranged to be two points which are spaced equally apart in the X-axis direction on the grating, with the exposure position serving as the center.

For example, by irradiating measurement beams from a total of three encoders including an encoder which can measure positional information in the X-axis direction and the Z-axis direction and an encoder which can measure positional information in the Y-axis direction and the Z-axis direction, on three measurement points that are noncollinear, and receiving the return lights, positional information of the movable body on which grating RG is provided can be measured in directions of six degrees of freedom. Further, the configuration of encoder system 73 is not limited to the embodiment described above, and is arbitrary.

Incidentally, in the embodiment above, while the grating was placed on the upper surface of the fine movement stage, that is, a surface that faces the wafer, as well as this, the grating can be formed on a wafer holder holding the wafer. In this case, even when a wafer holder expands or an installing position to the fine movement stage shifts during exposure, this can be followed up when measuring the position of the wafer holder (wafer). Further, the grating can be placed on the lower surface of the fine movement stage, and in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced.

Incidentally, in the embodiment above, while fine movement stage WFS is supported in a noncontact manner by coarse movement stage WCS by the action of the Lorentz force (electromagnetic force), besides this, for example, a vacuum preload type hydrostatic air bearing and the like can be arranged on fine movement stage WFS so that it is supported by levitation with respect to support coarse movement stage WCS. Further, in the embodiment above, while fine movement stage WFS could be driven in directions of all 6 degrees of freedom, the present invention is not limited to this, and fine movement stage WFS only needs to be able to move within a two-dimensional plane which is parallel to the XY plane. Further, fine movement stage drive system 52 is not limited to the magnet moving type described above, and can also be a moving coil type as well. Furthermore, fine movement stage WFS can also be supported in contact with coarse movement stage WCS. Accordingly, as fine movement stage drive system 52 which drives fine movement stage WFS with respect to coarse movement stage WCS, for example, a rotary motor and a ball screw (or a feed screw) can also be combined for use.

Further, in the embodiment above, while an example has been shown where the first encoder system 17*a* and the second encoder system 17*b* configuring relative stage position measurement system 17 are each equipped with two X heads and one Y head, besides this, for example, two each of two-dimensional heads (2D heads) whose measurement directions are in two directions, which are the X-axis direction and the Y-axis direction, can be provided. Further, besides an optical encoder, a magnetic encoder can also be used.

Incidentally, the fine movement stage position measurement system can be configured so that position measurement is possible within the total movement range of wafer stage WST. In this case, wafer stage position measurement system 16 will not be required. Further, in the embodiment above, base board 12 can be a counter mass which can move by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Further, in the embodiment above, the case has been described where the exposure apparatus is a liquid immersion type exposure apparatus. However, the present invention is not limited to this, but can also be applied suitably in a dry type exposure apparatus that performs exposure of wafer W without liquid (water).

Incidentally, in the embodiment above, the case has been described where the present invention is applied to a scanning stepper; however, the present invention is not limited to this, and can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to position the stage with high precision based on the measurement values of the encoder, which in turn makes it possible to transfer a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

In addition, the illumination light IL of the exposure apparatus 10 in the abovementioned embodiment is not limited to light with a wavelength of 100 nm or greater, and, of course, light with a wavelength of less than 100 nm may be used. For example, the present invention can be applied to an EUV exposure apparatus that uses an EUV (Extreme Ultraviolet) light in a soft X-ray range (e.g. a wavelength range from 5 to 15 nm). In addition, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder system and a laser interferometer system.

Further, as is disclosed in, for example, PCT International Publication No. 2001/035168, the present invention can also be applied to an exposure apparatus (lithography system) that forms line-and-space patterns on a wafer W by forming interference fringes on wafer W.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all publications, the PCT International Publications, the U.S. Patent Applications and the U.S. Patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body apparatus, comprising:
a base member;
a first movable member which is movable, on the base member, at least parallel to a two-dimensional plane including a first axis and a second axis that are orthogonal to each other;
a second movable member which is held by the first movable member and is relatively movable at least with respect to the first movable member within a plane parallel to the two-dimensional plane, the second movable member having a measurement plane provided on a surface substantially parallel to the two-dimensional plane of the second movable member;
a first measurement system which has a measurement member located above the base member and below the second movable member and having a head section at a part of the measurement member, the head section irradiating at least one first measurement beam from below on the measurement plane and receiving light of the first measurement beam from the measurement plane, and the first measurement system measuring a positional information at least within the two-dimensional plane of the second movable member based on an output of the head section; and
a drive system which drives the second movable member in one of a singly driven manner and an integrally driven manner with the first movable member, based on the positional information measured by the first measurement system.

2. The movable body apparatus according to claim 1 wherein
a grating is formed on the measurement plane, and
the head section receives a diffraction light from the grating of the first measurement beam.

3. The movable body apparatus according to claim 2 wherein
the grating includes a first diffraction grating and a second diffraction grating whose periodic directions are in a direction parallel to the first axis and a direction parallel to the second axis, respectively, whereby
the head section irradiates a first axis direction measurement beam and a second axis direction measurement beam corresponding to the first diffraction grating and the second diffraction grating, respectively, as the first measurement beam, and receives a diffraction light from each of the gratings of the first axis direction measurement beam and the second axis direction measurement beam, and the first measurement system measures the positional information in the direction parallel to the first axis and the direction parallel to the second axis of the second movable member, based on the output of the head section.

4. The movable body apparatus according to claim 3 wherein
the head section irradiates at least two measurement beams whose irradiation points on the first diffraction grating are different to each other in the direction parallel to the second axis, on the first diffraction grating as the first axis direction measurement beam.

5. The movable body apparatus according to claim 4 wherein
the at least two measurement beams and the second axis direction measurement beam are each irradiated on an irradiation point on a straight line in parallel with the second axis on the grating.

6. The movable body apparatus according to claim 1, the apparatus further comprising:
a second measurement system which irradiates a plurality of second measurement beams on the second movable member, receives a reflection light of the plurality of second measurement beams, and measures a positional information of the second movable member in a direction orthogonal to the two-dimensional plane and in a tilt direction with respect to the two-dimensional plane, wherein the drive system drives the second movable member based on an output of the first measurement system and the second measurement system.

7. The movable body apparatus according to claim 1 wherein
one end, and an other end, which is on an opposite side of the one end with the measurement plane in between, of the second movable member are each supported by the first movable member, whereby
the drive system includes a first drive section which applies a drive force on the one end of the second movable member, and a second drive section which applies a drive force on the other end.

8. The movable body apparatus according to claim 7 wherein
the first drive section and the second drive section each include a coil unit placed at one of the first movable member and the second movable member and a magnet unit placed at the other of the first movable member and the second movable member, and drive the second movable member in a noncontact manner.

9. The movable body apparatus according to claim 7 wherein
the first drive section and the second drive section can generate a drive force in directions parallel to the first axis and the second axis, a direction orthogonal to a two-dimensional plane, and a rotational direction around an axis parallel to each of the first axis and the second axis, and a magnitude and a direction of generation of the drive force can each be controlled independently.

10. The movable body apparatus according to claim 9 wherein
the first movable member is supported in a noncontact manner above a base having an upper surface parallel to the two-dimensional plane.

11. The movable body apparatus according to claim 10 wherein
the drive system further includes a third drive section which drives the first movable member on the base, and the apparatus further comprises:
a controller which on moving the second movable member in a first direction of the directions parallel to the first axis and the second axis via the first drive section and the second drive section, provides an initial velocity in the first direction to the first movable member via the third drive section.

12. The movable body apparatus according to claim 11 wherein
the controller provides an initial velocity to the first movable member so that a centroid of a system including the second movable member and the first movable member performs a constant velocity movement in the first direction.

13. The movable body apparatus according to claim 1, the apparatus further comprising:
a third measurement system which measures relative positional information at least within the two-dimensional plane of the first movable member and the second movable member, wherein
the drive system drives the first movable member, based on the positional information of the second movable member measured by the first measurement system and the relative positional information measured by the third measurement system.

14. An exposure apparatus that forms a pattern on an object by an irradiation of an energy beam, the apparatus comprising:
the movable body apparatus according to claim 1 in which the object is mounted on the second movable member; and
a patterning device that irradiates the energy beam on the object mounted on the second movable member.

15. The exposure apparatus according to claim 14 wherein
at least a part of the second movable member is a solid section where a light can proceed inside,
the measurement plane is placed on a mounting surface side of the object of the second movable member, facing the solid section, and
the head section is placed on an opposite side of the mounting surface of the object, facing the solid section.

16. The exposure apparatus according to claim 15 wherein
the second movable member further has a support section which supports the solid section, and
at least a part of the support section is made from a material which is lighter than a material of the solid section.

17. The exposure apparatus according to claim 16 wherein the support section is hollow.

18. The exposure apparatus according to claim 17 wherein a heat insulating material is placed inside the support section.

19. The exposure apparatus according to claim 14 wherein
a measurement center which is a center of irradiation points of the first measurement beam irradiated on the measurement plane from the head section coincides with an exposure position which is a center of an irradiation area of the energy beam irradiated on the object.

20. The exposure apparatus according to claim 14 wherein
on scanning exposure in which the object is scanned in a scanning direction within the two-dimensional plane with respect to the energy beam,
the drive system drives and scans only the second movable member in the scanning direction, based on the positional information measured by the first measurement system.

21. The exposure apparatus according to claim 14 wherein
the first movable member has a space inside, and
the head section of the first measurement system is placed facing the measurement plane within the space of the first movable member.

22. The exposure apparatus according to claim 14 wherein
the first movable member moves in a direction opposite to the second movable member in accordance with a law of conservation of momentum, by an action of a drive force in directions parallel to the first axis and the second axis of the second movable member that the first movable member holds.

23. A device manufacturing method, the method including:
exposing an object using the exposure apparatus according to claim 14; and
developing the object which has been exposed.

24. An exposure apparatus that forms a pattern on an object by an irradiation of an energy beam, the apparatus comprising:
a first movable member which is movable at least parallel to a two-dimensional plane including a first axis and a second axis that are orthogonal to each other;
a second movable member having one end and an other end in a direction parallel to the second axis, the one end and the other end being independently and separately supported by a first part and a second part of the first movable member, respectively, so that the second movable member is relatively movable with respect to the first movable member within a plane parallel to the two-dimensional plane while holding the object, an outer edge of the one end of the second movable member being located outside of an inner edge of the first part of the first movable member in a direction of the second axis, and an outer edge of the other end of the second movable member being located outside of an inner edge of the second part of the first movable member in the direction of the second axis; and a drive system which includes a first drive section that applies a drive force on the one end of the second movable member and a second drive section that applies a drive force on the other end, and drives the second movable member in one of a singly driven manner and an integrally driven manner with the first movable member, whereby the first drive section and the second drive section can apply a drive force whose magnitude and a direction of generation can each be controlled independently to the one end and the other end of the second movable member, respectively, in directions parallel to the first axis and the second axis, a direction orthogonal to the two-dimensional plane, and a rotational direction around an axis parallel to the first axis.

25. The exposure apparatus according to claim 24 wherein the first drive section and the second drive section further apply a drive force around an axis parallel to the second axis where the magnitude and the direction of generation can each be controlled independently to the one end and the other end of the second movable member, respectively.

26. The exposure apparatus according to claim 24 wherein the first drive section and the second drive section each include a coil unit including two coil rows placed alongside in a direction parallel to the second axis in one of the first movable member and the second movable member, and a magnet unit including two magnet rows placed, corresponding to the two coil rows, alongside in a direction parallel to the second axis in an other of the first movable member and the second movable member, whereby an electromagnetic force generated by an electromagnetic interaction between the magnet unit and the coil unit drives the second movable member in a noncontact manner.

27. The exposure apparatus according to claim 24 wherein the first movable member is supported in a noncontact manner above a base having an upper surface parallel to the two-dimensional plane.

28. The exposure apparatus according to claim 27 wherein the drive system further includes a third drive section which drives the first movable member on the base, and the apparatus further includes a controller which on moving the second movable member in a first direction of the directions parallel to the first axis and the second axis via the first drive section and the second drive section, provides an initial velocity in the first direction to the first movable member via the third drive section.

29. The exposure apparatus according to claim 28 wherein the controller provides the initial velocity to the first movable member so that a centroid of a system including the second movable member and the first movable member performs a constant velocity movement in the first direction.

30. The exposure apparatus according to claim 24, the apparatus further comprising:

a first measurement system which measures a positional information at least within the two-dimensional plane of the second movable member; and a second measurement system which irradiates at least three second measurement beams on the second movable member and receives reflected lights of the at least three second measurement beams, and measures a positional information in a direction orthogonal to the two-dimensional plane of the second movable member in at least three points, wherein the drive system drives the second movable member based on an output of the first measurement system and the second measurement system.

31. The exposure apparatus according to claim 30 wherein the first movable member has a space inside, at least a part of the second movable member is a solid section where a light can travel inside, and on a mounting surface side of the object of the second movable member, a measurement plane is provided on a surface which faces the solid section and is substantially parallel to the two-dimensional plane, whereby the first measurement system has a head section which is placed inside the space of the first movable member, facing the solid section, on an opposite side of a mounting surface of the object, irradiates at least one measurement beam on the measurement plane and receives light from the measurement plane of the measurement beam, and the first measurement system measures a positional information of the second movable member at least within the two-dimensional plane, based on an output of the head section.

32. The exposure apparatus according to claim 31 wherein a measurement center which is a center of an irradiation point of the measurement beam irradiated on the measurement plane from the head section coincides with an exposure position which is a center of an irradiation area of the energy beam irradiated on the object.

33. The exposure apparatus according to claim 30, the apparatus further comprising:

a controller which controls the drive system, based on an output of the second measurement system to adjust a deflection of the second movable member on which the object is mounted.

34. The exposure apparatus according to claim 33 wherein the controller controls the drive system to suppress deformation of the object caused by its own weight.

35. The exposure apparatus according to claim 33, the apparatus further comprising:

an optical system through which the energy beam irradiated on the object passes, wherein the controller controls the drive system so that an area including an irradiation area of the energy beam on a surface of the object mounted on the second movable member falls within a depth of focus of the optical system.

36. The exposure apparatus according to claim 30 wherein on scanning exposure where the object is scanned in a scanning direction within the two-dimensional plane with respect to the energy beam, the drive system scans and drives only the second movable member in the scanning direction, based on the positional information measured by the first measurement system.

37. A device manufacturing method, the method including:
exposing an object using the exposure apparatus according to claim 24; and
developing the object which has been exposed.

38. An exposure method in which a pattern is formed on an object by an irradiation of an energy beam, the method comprising:
a mounting process in which the object is mounted on a second movable member that is held by a first movable member, relatively movable with respect to the first movable member at least within a plane parallel to a two-dimensional plane including a first axis and a second axis that are orthogonal to each other, the first movable member moving on a base member and being movable at least parallel to the two-dimensional plane, and the second movable member having a measurement plane provided on a surface substantially parallel to the two-dimensional plane of the second movable member; and
a scanning process in which the object is scanned with respect to the energy beam, by measuring a positional information at least within the two-dimensional plane of the second movable member based on an output of a head section, which is provided at a part of a measurement member located above the base member and below the second movable member, irradiates at least one first measurement beam from below on the measurement plane and receives a light of the first measurement beam from the measurement plane, and by driving the second movable member in a scanning direction within the two-dimensional plane based on the positional information which has been measured.

39. The exposure method according to claim 38, the method further comprising:
a stepping process in which the positional information at least within the two-dimensional plane of the second movable member is measured based on the output of the head section, and relative positional information at least within the two-dimensional plane of the first movable member and the second movable member is also measured, and based on the positional information and the relative positional information that have been measured, the first movable member is stepped and driven in a non-scanning direction within the two-dimensional plane.

40. A device manufacturing method, the method including:
exposing the object using the exposure method according to claim 38; and
developing the object which has been exposed.

41. An exposure method in which a pattern is formed on an object by an irradiation of an energy beam, the method comprising:
making a first part and a second part of a first movable member, which is movable at least parallel to a two-dimensional plane including a first axis and a second axis that are orthogonal to each other, independently and separately support one end and an other end, respectively, in a direction parallel to the second axis of a second movable member holding the object, so that the second movable member becomes relatively movable within a plane parallel to the two-dimensional plane with respect to the first movable member, an outer edge of the one end of the second movable member being located outside of an inner edge of the first part of the first movable member in a direction of the second axis, and an outer edge of the other end of the second movable member being located outside of an inner edge of the second part of the first movable member in the direction of the second axis; and
applying a drive force whose magnitude and a direction of generation can each be controlled independently, to the one end and the other end of the second movable member, in directions parallel to the first axis and the second axis, a direction orthogonal to a two-dimensional plane, and a rotational direction around an axis parallel to the first axis.

42. The exposure method according to claim 41 wherein
when applying the drive force, a drive force around an axis parallel to the second axis whose magnitude and a direction of generation can each be controlled independently is further applied to the one end and the other end of the second movable member.

43. The exposure method according to claim 41 wherein
the second movable member is driven in a noncontact manner with an electromagnetic force serving as a drive force for each direction, the electromagnetic force being generated by an electromagnetic interaction between a coil unit including
two coil rows placed alongside in a direction parallel to the second axis in one of the first movable member and the second movable member and
a magnet unit including two magnet rows placed alongside in a direction parallel to the second axis in the other of the first movable member and the second movable member, corresponding to the two coil rows.

44. The exposure method according to claim 41 wherein
a drive force in a rotational direction around an axis parallel to the first axis is controlled, based on a positional information of the second movable member in a tilt direction with respect to the two-dimensional plane, so that a deflection of the second movable member on which the object is mounted is adjusted.

45. The exposure method according to claim 44 wherein
a drive force in a rotational direction around an axis parallel to the first axis is controlled to suppress deformation of the object caused by its own weight.

46. The exposure method according to claim 44 wherein
the energy beam is irradiated on a surface of the object mounted on the second movable member via an optical system, and
a drive force in a rotational direction around an axis parallel to the first axis is controlled so that an irradiation area of the energy beam falls within a depth of focus of the optical system.

47. The exposure method according to claim 41 wherein
the first movable member has a space inside.

48. A device manufacturing method, the method including:
exposing the object using the exposure method according to claim 41; and
developing the object which has been exposed.

* * * * *